(12) United States Patent
Agarwal et al.

(10) Patent No.: US 7,304,334 B2
(45) Date of Patent: Dec. 4, 2007

(54) SILICON CARBIDE BIPOLAR JUNCTION TRANSISTORS HAVING EPITAXIAL BASE REGIONS AND MULTILAYER EMITTERS AND METHODS OF FABRICATING THE SAME

(75) Inventors: Anant K. Agarwal, Chapel Hill, NC (US); Sumithra Krishnaswami, Morrisville, NC (US); Sei-Hyung Ryu, Cary, NC (US); Edward Harold Hurt, Durham, NC (US)

(73) Assignee: Cree, Inc., Durham, NC (US)

( * ) Notice: Subject to any disclaimer, the term of this patent is extended or adjusted under 35 U.S.C. 154(b) by 118 days.

(21) Appl. No.: 11/229,474

(22) Filed: Sep. 16, 2005

(65) Prior Publication Data

US 2007/0235757 A1 Oct. 11, 2007

(51) Int. Cl.
*H01L 29/739* (2006.01)
*H01L 31/00* (2006.01)

(52) U.S. Cl. ............... 257/197; 257/591; 257/E33.035; 257/47; 257/370; 257/509; 257/565

(58) Field of Classification Search ............... 257/197, 257/591, E33.035
See application file for complete search history.

(56) References Cited

U.S. PATENT DOCUMENTS

| | | | |
|---|---|---|---|
| 4,865,685 A | | 9/1989 | Palmour |
| 4,912,064 A | | 3/1990 | Kong et al. |
| 4,945,394 A | * | 7/1990 | Palmour et al. ............... 257/77 |
| 4,981,551 A | | 1/1991 | Palmour |
| 5,011,549 A | | 4/1991 | Kong et al. |
| 5,318,915 A | * | 6/1994 | Baliga et al. ............... 438/520 |
| 5,539,217 A | * | 7/1996 | Edmond et al. ............... 257/77 |
| 6,218,254 B1 | * | 4/2001 | Singh et al. ............... 438/364 |
| 6,329,675 B2 | * | 12/2001 | Singh et al. ............... 257/77 |
| 6,870,204 B2 | * | 3/2005 | Torvik et al. ............... 257/197 |
| 2001/0011729 A1 | * | 8/2001 | Singh et al. ............... 257/77 |
| 2003/0080842 A1 | * | 5/2003 | Sumakeris et al. ............ 336/77 |

FOREIGN PATENT DOCUMENTS

WO  WO 2005/093795  10/2005

OTHER PUBLICATIONS

U.S. Appl. No. 60/554,123, filed Mar. 18, 2004, Sumakeris.
Agarwal et al. "Evolution of the 1600 V, 20 A, SiC Bipolar Junction Transistors" *Proceedings of the 17th International Symposium on Power Semiconductor Devices & IC's* May 23-26, 2005, Santa Barbara, CA.

(Continued)

*Primary Examiner*—Michelle Estrada
*Assistant Examiner*—Nicholas J. Tobergte
(74) *Attorney, Agent, or Firm*—Myers Bigel Sibley & Sajovec

(57) ABSTRACT

Bipolar junction transistors (BJTs) are provided including silicon carbide (SiC) substrates. An epitaxial SiC base region is provided on the SiC substrate. The epitaxial SiC base region has a first conductivity type. An epitaxial SiC emitter region is also provided on the SiC substrate. The epitaxial SiC emitter region has a second conductivity type, different from the first conductivity type. The epitaxial SiC emitter region has first and second portions. The first portion is provided on the SiC substrate and the second portion is provided on the first portion. The second portion has a higher carrier concentration than the first portion. Related methods of fabricating BJTs are also provided herein.

14 Claims, 15 Drawing Sheets

OTHER PUBLICATIONS

Agarwal et al. "Influence of Basal Plane Dislocation Induced Stacking Faults on the Current Gain in SiC BJTs" *ISPSD Proceedings* 2005, p. 271.

Danielsson et al. "A 4H-SiC BJT with an Epitaxially Regrown Extrinsic Base Layer" *Materials Science Forum* vols. 483-485, pp. 905-908 (2005).

Galeckas et al. "Recombination-Enhanced Extension of Stacking Faults in 4H-SiC *p-i-n* Diodes Under Forward Bias" *Applied Physics Letters* 81(5): 883-885 (2002).

Krishnaswami et al. "1000-V, 30-A 4H-SiC BJTs with High Current Gain" *IEEE Electron Device Letters* 26(3): 175-177 (2005).

Lendenmann et al. Materials Science Forum vol. 353-356 (2001) p. 727.

Palmour et al. "Surface Characterisitics of Monocrystalline Beta-SiC Dry Etched in Fluorinated Gases" *Material Research Soc Symp Proc* 76: 185 (1987).

Tang et al. "An Impaled-Emitter 4H-SiC Bipolar Transistor with High Current Gain" Publication unkown, date unknown.

Sumakeris et al. *Materials Science Forum* vol. 457-460 (2004) p. 1113.

Danielsson et al., "A 4H-SiC BJT with an Epitaxially Regrown Extrinsic Base Layer" *Materials Science Forum*, vol. 483-485, Aug. 31, 2004, pp. 905-908.

Domeij et al., "SiC power bipolar junction transistors —Modeling and improvement of the current gain" from the *2005 European Conference on Power Electronics and Applications,* Dresden, Germany, Sep. 11-14, 2005, pp. 1-7.

International Search Report and the Written Opinion of the International Searching Authority, corresponding to International Application No. PCT/US2006/027202, mailed Feb. 1, 2007.

* cited by examiner

SILICON CARBIDE BIPOLAR JUNCTION TRANSISTORS HAVING EPITAXIAL BASE REGIONS AND MULTILAYER EMITTERS AND METHODS OF FABRICATING THE SAME

STATEMENT OF GOVERNMENT INTEREST

This invention was made with Government support under contract number W911NF-04-2-0022 awarded by the Department of the Army. The Government has certain rights in this invention.

FIELD OF THE INVENTION

This invention relates to power semiconductor devices and related methods of fabricating power semiconductor devices and, more particularly, to high voltage silicon carbide devices and related methods of fabricating high voltage silicon carbide devices.

BACKGROUND OF THE INVENTION

Power devices are widely used to carry large currents and support high voltages. Conventional power devices are generally fabricated from monocrystalline silicon semiconductor material. One type of power device is the bipolar junction transistor (BJT). The BJT is a well-known and frequently used power device. A BJT typically includes a semiconductor material having two opposing p-n junctions in close proximity to one another, thus, BJTs may be referred to as "n-p-n" or "p-n-p" transistors.

In operation, current carriers enter a region of the semiconductor material of a first conductivity type adjacent one of the p-n junctions, which is called the emitter. Most of the charge carriers exit the device from a region of the semiconductor material of the first conductivity type adjacent the other p-n junction, which is called the collector. A small portion of semiconductor material known as the base, having a second conductivity type, opposite the first conductivity type of the collector and the emitter, is positioned between the collector and the emitter. The two p-n junctions of the BJT are formed where the collector meets the base and where the base meets the emitter.

When current is injected into or extracted from the base, depending upon whether the BJT is n-p-n or p-n-p, the flow of charge carriers, i.e., electrons or holes, which can move from the emitter to the collector, may be affected. Typically, small currents applied to the base can control proportionally larger currents passing through the BJT, giving it usefulness as a component of electronic circuits. Structural and operational details of BJT's are discussed in Solid State Electronic Devices by B. Streetman (2nd edition (1980), chapter 7), the content of which is incorporated herein by reference as if set forth in its entirety.

The material that makes up a device contributes to the operability and usefulness of the device. For example, conventional BJTs are typically formed of silicon (Si), but can also include gallium arsenide (GaAs) and indium phosphide (InP). Recently, silicon carbide (SiC) has been used as a material for BJTs. SiC has advantageous semiconductor characteristics, for example, a wide bandgap, high electric field breakdown strength, high electron mobility, high thermal conductivity, high melting point, and high saturated electron drift velocity. Thus, relative to devices formed in other semiconductor materials, for example, Si, electronic devices formed in SiC may have the capability of operating at higher temperatures, at high power densities, at higher speeds, at higher power levels and even under high radiation densities.

Due to their ability to function at high frequencies, high temperatures, and high power levels, SiC transistors are highly desirable for use in applications such as high frequency transmitters for radar and communications, for high power switching applications, and for high temperature operations such as jet engine control. Accordingly, methods of producing device quality SiC and devices formed from SiC have been of interest to scientists and engineers for several decades.

SiC crystallizes in over 150 different polytypes, or crystal structures, of which the most common are designated 3C, 4H, and 6H where "C" stands for "cubic" and "H" for "hexagonal." SiC is a difficult material to use in semiconductor devices. In particular, the high melting point of SiC may render techniques, such as alloying and diffusion of dopants, more difficult, usually because a number of the other materials necessary to perform such operations tend to break down at the high temperatures used to affect SiC. SiC is also an extremely hard material, and indeed its most common use is as an abrasive. Attempts have been made, with some success, in manufacturing junctions, diodes, transistors, and other devices from SiC.

SiC BJTs are discussed in, for example, U.S. Pat. No. 4,945,394 to Palmour et al., the disclosure of which is incorporated herein by reference as if set forth in its entirety. As discussed therein, SiC BJTs are formed having a base and an emitter formed as wells using high temperature ion implantation. Furthermore, SiC BJTs are also discussed in U.S. Pat. No. 6,218,254 to Singh et al., the content of which is incorporated herein by reference as if set forth in its entirety. As discussed therein, SiC BJTs having a base and an emitter are formed using epitaxial growth and high temperature ion implantation. Singh further discusses the use of removable dielectric spacers to improve the alignment of base and emitter regions.

SiC BJTs typically include at least one highly doped implant region for the base or the emitter. The formation of the implant region may cause damage to the SiC crystal. For example, the current gain of the device may be reduced due to surface recombination current due to implant induced defects. The current gain of the device may be reduced as a function of time due to stacking faults in the base region, which may result from the defects created by the implantation process. Furthermore, the highly doped emitter regions present in these devices may have a poor lifetime, which may further reduce the current gain of the device.

Referring now to FIG. 1, a cross section of a conventional SiC BJT will be discussed. As illustrated in FIG. 1, an N⁻ SiC layer 11 is provided on a highly doped N⁺ SiC substrate 10. A p-type (P) SiC layer 12 is provided on the N⁻ SiC layer 11. As further illustrated in FIG. 1, n-type emitter regions 20 (N⁺) and highly doped p-type base regions 25 (P⁺) are provided on the p-type layer 12. The emitter regions 20 may be formed by epitaxial growth and subsequent etching and base regions 25 may be formed by implantation techniques. In particular, the implantation of the P⁺ base regions 25 may be carried out at from about 650° C. to about 1100° C. using aluminum ions (Al⁺) having energy ranging from about 20 keV to about 360 keV. As discussed above, this implant may cause damage to the SiC crystal, which may not be entirely removed by a high temperature (1600-1700° C.) activation anneal.

In particular, the defects introduced by the implant may result in surface recombination current and stacking fault formation in the base region of the device. This relationship is represented by the equation:

$$\beta = i_C/i_B$$

where β represents current gain, $i_c$ represents collector current and $i_B$ represents base current. Base current $i_B$ may be further represented by $$i_B = i_{Br} + i_{Bi} + i_{Bsr};$$

where $i_{Br}$ is recombination current, $i_{Bi}$ represents majority carriers injected across the emitter junction, and $i_{Bsr}$ represents surface recombination current. Current gain may be represented by the equation:

$$\beta = i_C/(i_{Br} + i_{Bi} + i_{Bsr}).$$

Accordingly, any increase in surface recombination current $i_{Bsr}$ in the base region yields a lower current gain for the device.

Referring again to FIG. 1, a passivation layer 18 is provided on the surface of the device. The BJT further includes an ohmic metal 30/31 and an overlayer metal 16 that provide contacts to the base (B) regions 25, the emitter (E) regions 20 and the collector (C) regions 10/11. The highly doped regions designated as N+ 20, 10 and P+ 25 may be provided to improve the quality of the ohmic contacts.

SUMMARY OF THE INVENTION

Some embodiments of the present invention provide bipolar junction transistors (BJTs) including silicon carbide (SiC) substrates. An epitaxial SiC base region is provided on the SiC substrate. The eptiaxial SiC base region has a first conductivity type. An epitaxial SiC emitter region is also provided on the SiC substrate. The epitaxial SiC emitter region has a second conductivity type, different from the first conductivity type. The epitaxial SiC emitter region has first and second portions. The first portion is provided on the SiC substrate and the second portion is provided on the first portion remote from the SiC substrate. The second portion has a higher carrier concentration than the first portion.

In some embodiments of the present invention, the epitaxial SiC base region includes a first p-type epitaxial SiC layer on the SiC substrate. A first p-type epitaxial SiC region may be provided on the first p-type epitaxial SiC layer. The first p-type epitaxial SiC region may have a higher carrier concentration than the first p-type epitaxial SiC layer. A second p-type epitaxial SiC region may be provided on the first p-type epitaxial SiC region, remote from the first p-type epitaxial SiC layer. The second p-type epitaxial SiC region may have a higher carrier concentration than the first p-type epitaxial SiC region.

In further embodiments of the present invention, the first p-type epitaxial SiC layer may have a carrier concentration of from about $1.0 \times 10^{16}$ cm$^{-3}$ to about $1.0 \times 10^{19}$ cm$^{-3}$ and a thickness of from about 0.1 μm to about 10 μm. The first p-type epitaxial SiC region may have a carrier concentration of from about $1.0 \times 10^{18}$ cm$^{-3}$ to about $1.0 \times 10^{19}$ cm$^{-3}$ and a thickness of from about 0.1 μm to about 10 μm. The second p-type epitaxial SiC region may have a carrier concentration of from about $1.0 \times 10^{19}$ cm$^{-3}$ to about $5 \times 10^{20}$ cm$^{-3}$ and a thickness of from about 0.1 μm to about 3.0 μm.

In still further embodiments of the present invention; the epitaxial SiC base region may include a first p-type epitaxial SiC layer on the SiC substrate and a p-type epitaxial SiC region on the first p-type epitaxial SiC layer, remote from the SiC substrate. The p-type epitaxial SiC region may have a higher carrier concentration than the first p-type epitaxial SiC layer. The first p-type epitaxial SiC layer may have a carrier concentration of from about $1.0 \times 10^{16}$ cm$^{-3}$ to about $1.0 \times 10^{19}$ cm$^{-3}$ and a thickness of from about 0.1 μm to about 10 μm. The p-type epitaxial SiC region may have a carrier concentration of from about $1.0 \times 10^{18}$ cm$^{-3}$ to about $5 \times 10^{20}$ cm$^{-3}$ and a thickness of from about 0.1 μm to about 10 μm.

In some embodiments of the present invention, the first portion of the epitaxial SiC emitter region may include n-type SiC having a carrier concentration of from about $1.0 \times 10^{17}$ cm$^{-3}$ to about $5 \times 10^{19}$ cm$^{-3}$ and may have a thickness of from about 0.1 μm to about 5 μm. The second portion of the epitaxial SiC emitter region may include n-type SiC having a carrier concentration of from about $5 \times 10^{18}$ cm$^{-3}$ to about $5 \times 10^{20}$ cm$^{-3}$ and may have a thickness of from about 0.1 μm to about 3.0 μm.

In further embodiments of the present invention, a first layer of SiC having the second conductivity type may be provided on the SiC substrate between the SiC substrate and the epitaxial SiC base region. A second layer of SiC having the first conductivity type may be provided on the first layer of SiC. The epitaxial SiC base region and the epitaxial SiC emitter region may be on the second layer of SiC, remote from the first layer of SiC. The first conductivity type may be p-type conductivity SiC and the second conductivity type may be n-type conductivity SiC. The first layer of SiC may have a carrier concentration of from about $1.0 \times 10^{13}$ cm$^{-3}$ to about $1.0 \times 10^{17}$ cm$^{-3}$ and a thickness of from about 1.0 μm to about 250 μm.

Still further embodiments of the present invention provide BJTs having a silicon carbide (SiC) substrate and an epitaxial SiC emitter region on the SiC substrate. The epitaxial SiC emitter region has a first conductivity type. The epitaxial SiC emitter region has first and second portions. The first portion is provided on the SiC substrate and the second portion is provided on the first portion, remote from the SiC substrate. The second portion has a higher carrier concentration than the first portion.

While the present invention is described above primarily with reference to BJTs, methods of fabricating BJTs are also provided.

DETAILED DESCRIPTION OF EMBODIMENTS OF THE INVENTION

Figure 1:
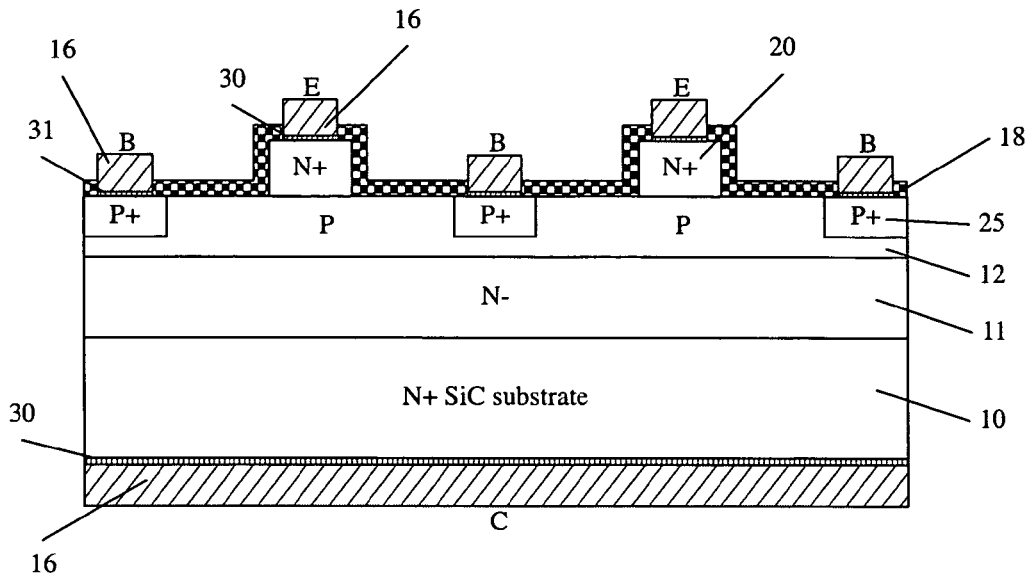
FIG. 1 is a cross section illustrating a conventional silicon carbide (SiC) bipolar junction transistor (BJT).

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the Figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described with reference to a particular polarity conductivity type for various layers/regions. However, as will be appreciated by those of skill in the art, the polarity of the regions/layers may be inverted to provide an opposite polarity device. For example, the terms "first conductivity type" and "second conductivity type" refer to opposite conductivity types such as n or p-type, however, each embodiment described and illustrated herein includes its complementary embodiment as well.

In particular, BJTs are active, three terminal semiconductor devices including two back-to-back p-n junctions in close proximity. BJT's are broadly characterized as n-p-n or p-n-p depending on the conductivity types of their respective bases, collectors, and emitters. It will be understood that although only n-p-n BJTs will be discussed herein, embodiments of the present invention are not limited to this configuration. For example, p-n-p transistors may also be provided by reversing the described conductivity types without departing from the scope of the present invention.

As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region" and "implanted region" structurally distinguish differing regions of silicon carbide and may be used herein as a recitation of structural characteristics of the regions of silicon carbide and/or as recitations of methods of forming such regions of silicon carbide. The fabrication of epitaxial layers of SiC is discussed in, for example, U.S. Pat. Nos. 5,011,549 and 4,912,064 to Kong et al., the disclosures of which are hereby incorporated herein by reference as if set forth in their entirety.

Some embodiments of the present invention provide bipolar junction transistors (BJTs) having epitaxial silicon carbide (SiC) base regions and multilayer epitaxial emitter regions. The use of an epitaxial SiC base region in BJTs according to some embodiments of the present invention may eliminate the need for implantation and a subsequent high temperature anneal, which may cause damage to the SiC crystal and, thereby, cause a reduction in the current gain of the device. Accordingly, BJTs according to some embodiments of the present invention may have improved current gains relative to conventional devices. Furthermore, the use of a multilayer epitaxial SiC emitter region may allow the current gain of the device to be further increased as discussed further herein with respect to FIGS. 2 through 16.

SiC BJTs may offer the potential of operating reliably at much higher junction temperatures as compared to, for example, SiC MOSFETs. In addition, the overall losses (switching and conduction) of the SiC BJT operating at, for example, 250° C., are approximately from about 50 to about 60 percent lower than the comparable Si Insulated Gate Bipolar Transistor (IGBT) operating at 25° C. In many applications, the combination of higher junction temperature and reduced losses may result in a sufficient reduction of cooling requirements to warrant a more complicated gate drive circuit used to operate BJTs. In hybrid vehicles, Si IGBTs operate with junction temperatures in the range of from about 115 to about 125° C., dangerously close to the maximum allowable junction temperature for Si IGBTs. Any perturbation in the environment, such as loss of coolant, difficult terrain and the like, could easily cause the Si IGBTs to malfuction. SiC BJTs according to some embodiments of the present invention may be capable of operating at higher junction temperatures and, therefore, may not malfunction as discussed above as will be discussed further herein.

Figure 2:
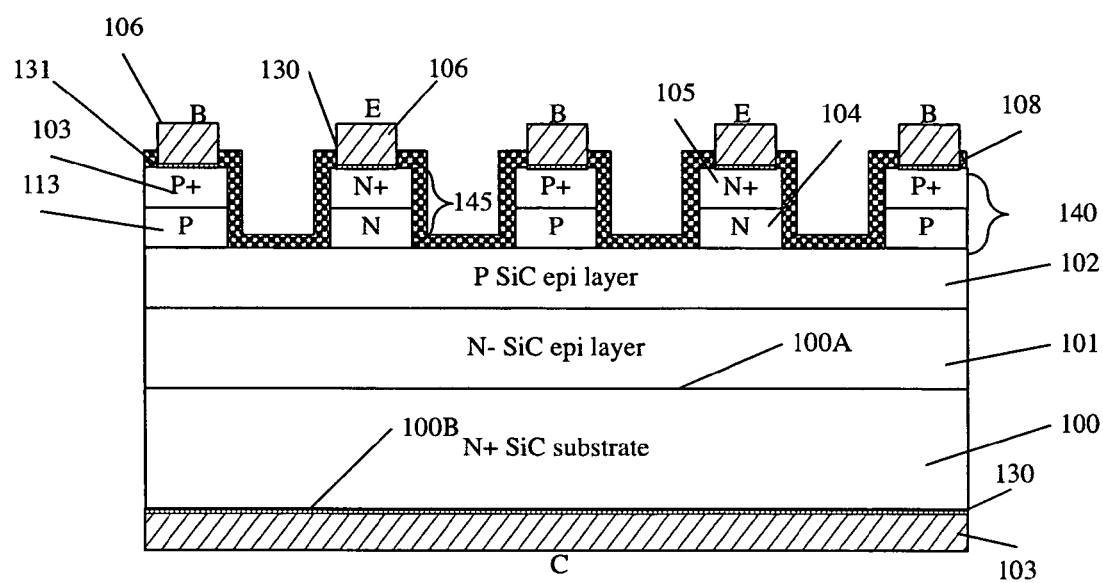
FIG. 2 is a cross section illustrating SiC BJTs according to some embodiments of the present invention.

Referring now to FIG. 2, a cross section of BJTs according to some embodiments of the present invention will be discussed. As illustrated in FIG. 2, a silicon carbide (SiC) substrate 100 may be provided. The polarity of the substrate 100 may be n-type or p-type SiC having a polytype of, for example, 3C, 2H, 4H, 6H or 15R. For exemplary purposes only, devices discussed according to embodiments of the present invention illustrated in FIG. 2 include n-type SiC substrates 100. As illustrated in FIG. 2, the substrate 100 is a highly doped n-type SiC (N$^+$). As used herein, "P$^+$" or "N$^+$" refer to regions that are defined by higher carrier concentrations than are present in adjacent or other regions of the same or another layer or substrate. Similarly, "P$^-$" or "N$^-$" refer to regions that are defined by lower carrier concentrations than are present in adjacent or other regions of the same or another layer. The substrate 100 may be doped with n-type dopants, such as nitrogen. The substrate may have a carrier concentration of from about $1.0 \times 10^{18}$ cm$^{-3}$ to about $5.0 \times 10^{19}$ cm$^{-3}$ and a thickness of from about 200 μm to about 500 μm.

As further illustrated in FIG. 2, a first epitaxial layer 101 is provided on a first side 100A of the SiC substrate 100. The first epitaxial layer 101 may be doped with n-type dopants, such as nitrogen. The first epitaxial layer 101 may have a carrier concentration of from about $1.0 \times 10^{13}$ cm$^{-3}$ to about $10 \times 10^{17}$ cm$^{-3}$ and a thickness of from about 1.0 μm to about 250 μm. The substrate 100 and the first epitaxial layer 101 define the collector (C) region of the BJT. A second epitaxial layer 102 is provided on the first epitaxial layer 10 1 and may be doped with p-type dopants, such as aluminum or boron. The second epitaxial layer 102 may have a carrier concentration of from about $1.0 \times 10^{16}$ cm$^{-3}$ to about $1.0 \times 10^{19}$ cm$^{-3}$ and a thickness of from about 0.1 μm to about 10 μm.

Figure 4:
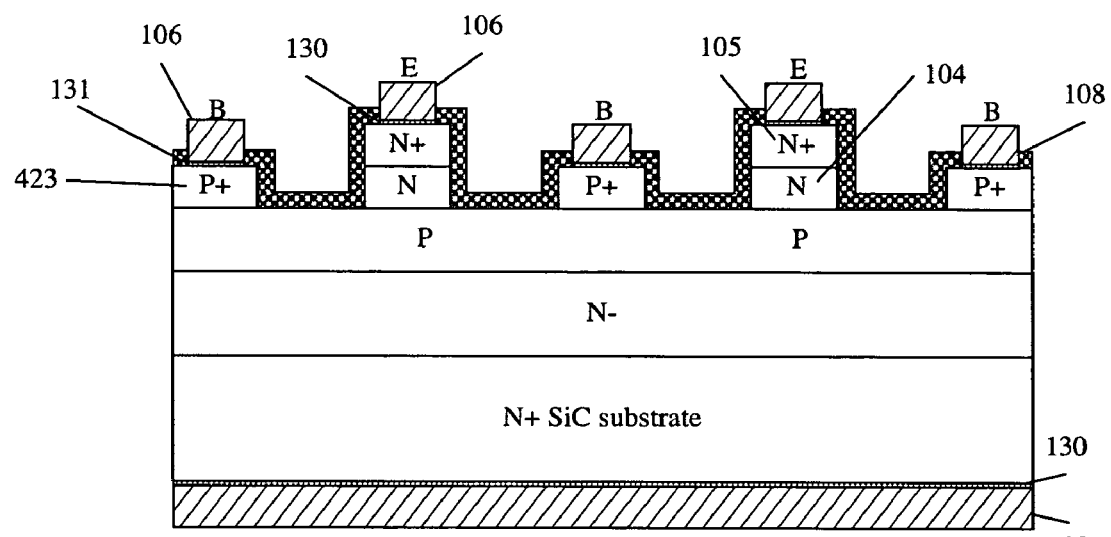
FIG. 4 is a cross section illustrating SiC BJTs according to further embodiments of the present invention.

An epitaxial SiC base contact region 140 is provided on the second epitaxial layer 102. As illustrated in FIG. 2, the epitaxial SiC base contact region 140 includes a first p-type epitaxial SiC region 113 on the second epitaxial layer and a second p-type epitaxial SiC region 103 on the first p-type epitaxial SiC region 113. The first p-type epitaxial SiC region 113 has a carrier concentration of from about $1.0 \times 10^{18}$ cm$^{-3}$ to about $1.0 \times 10^{19}$ cm$^{-3}$ and a thickness of from about 0.1 μm to about 10 μm. The second p-type epitaxial SiC region 103 has a carrier concentration of from about $1.0 \times 10^{19}$ cm$^{-3}$ to about $5.0 \times 10^{20}$ cm$^{-3}$ and a thickness of from about 0.1 μm to about 3.0 μm. The second epitaxial base layer 102 and the epitaxial SiC base contact region (first and second p-type epitaxial SiC regions 113 and 103) form the base (B) region of the BJT according to some embodiments of the present invention. Although the epitaxial SiC base region 140 is illustrated as having first and second p-type epitaxial SiC regions 113 and 103, embodiments of the present invention are not limited to this configuration. For example, as illustrated in FIG. 4, the epitaxial SiC base region can be a single p-type region 423, which will be discussed further below with respect to FIG. 4.

Thus, according to some embodiments of the present invention, the SiC base contact region is epitaxially grown, which may eliminate the need for implantation and high temperature anneals that may damage the SiC crystal. Accordingly, devices according to some embodiments of the present invention may have higher current gains as discussed further herein.

As further illustrated in FIG. 2, an epitaxial SiC emitter region 145 is provided on the second epitaxial layer 102. As illustrated, the epitaxial SiC emitter region 145 has an n-type conductivity. The epitaxial SiC emitter region 145 has first (N) and second (N$^+$) portions 104 and 105, respectively. The first portion 104 of the epitaxial SiC emitter region is provided on the second epitaxial layer 102 and is doped with n-type dopants, such as nitrogen. The first portion 104 of the epitaxial SiC emitter region has a carrier concentration of from about $1.0 \times 10^{17}$ cm$^{-3}$ to about $5 \times 10^{19}$ cm$^{-3}$ and a thickness of from about 0.1 μm to about 5.0 μm. The second portion 105 of the epitaxial SiC emitter region is doped with n-type dopants, such as nitrogen, and has a higher carrier concentration relative to the first portion 104. In particular, the second portion 105 of the epitaxial SiC emitter region has a carrier concentration of from about $5 \times 10^{18}$ cm$^{-3}$ to about $5 \times 10^{20}$ cm$^{-3}$ and a thickness of from about 0.1 μm to about 3.0 μm. Thus, according to some embodiments of the present invention, the epitaxial SiC emitter region 145 includes a low-doped n-type layer 104 that may provide improved injection efficiency and a highly doped n-type layer 105 that may provide an improved contact surface.

Figure 8:
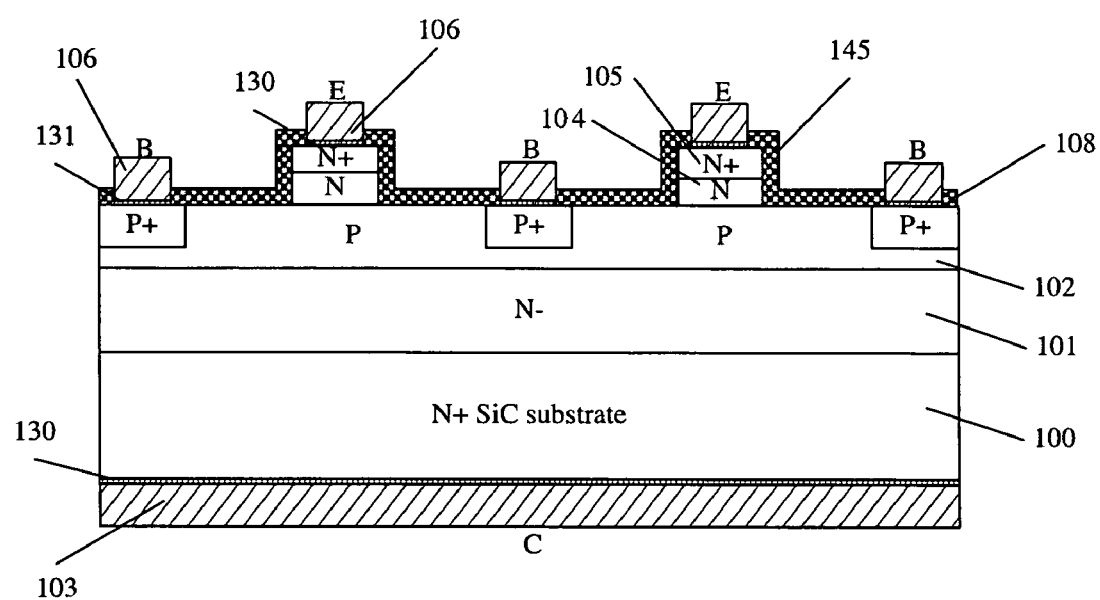
FIG. 8 is a cross section illustrating SiC BJTs according to some embodiments of the present invention.
Figure 9:
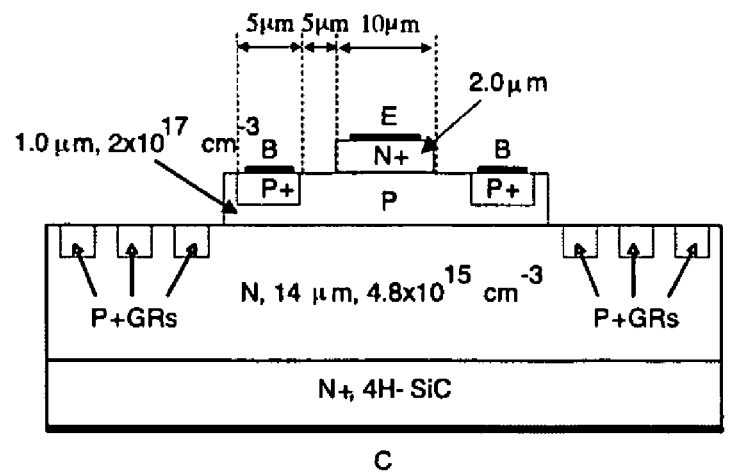
FIG. 9 is a cross section of a 4H SiC BJT.
Figure 10:
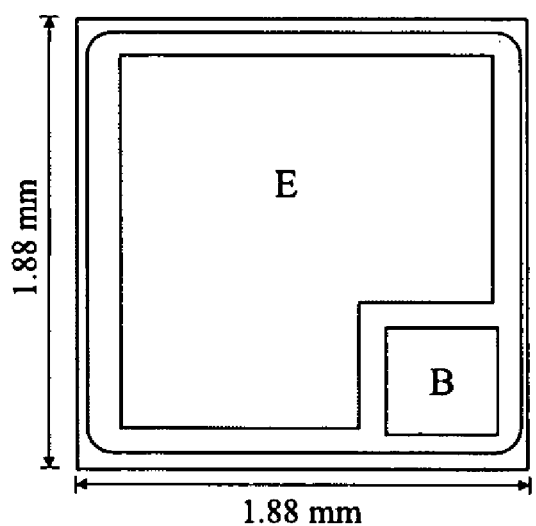
FIG. 10 is a plan view of the 4H-SiC BJT of FIG. 9.

It will be understood that although embodiments of the present invention illustrated in FIG. 1 include both the epitaxial SiC base region 140 and the epitaxial SiC emitter region 145, embodiments of the present invention are not limited to this configuration. For example, as illustrated in FIG. 8, the epitaxial SiC emitter region 145 having first (N) and second (N$^+$) portions 104 and 105, respectively, may be provided without the epitaxial SiC base region 140 according to some embodiments of the present invention.

A passivation layer 108 is provided on the second epitaxial layer 102, the epitaxial SiC base region 140 and the epitaxial SiC emitter region 145. The passivation layer 108 may include, for example, thermally grown silicon dioxide ($SiO_2$), chemical vapor deposited $SiO_2$ and/or chemical vapor deposited silicon nitride ($Si_3N_4$). Ohmic metal 130, suitable for n-type silicon carbide, is provided on the second portion 105 of the epitaxial SiC emitter region 145 for emitter fabrication. The ohmic metals are annealed to provided ohmic contacts as discussed further below. Some embodiments of the present invention include conductive substrates 100. In these embodiments of the present invention, ohmic metal 130 is also provided on a second side 100B of substrate 100 for collector fabrication. It will be understood by those skilled in the art that the present invention could be implemented using a non-conducting substrate, such as semi-insulating silicon carbide or sapphire, in which case the ohmic metal 130 for collector formation would be provided on a surface of the first SiC layer 101.

Ohmic metal 131, suitable for p-type silicon carbide, is provided on the second SiC p-type region 103 for base fabrication. Metals and/or metal composites may be appropriate for the ohmic contacts 130 and 131. For example, nickel or nickel-titanium combinations are appropriate ohmic contacts 130 to n-type silicon carbide while aluminum or aluminum-titanium combinations are appropriate ohmic contacts 131 to p-type silicon carbide. Furthermore, cobalt silicide ($CoSi_2$) may also be used as an ohmic contact material to p-type silicon carbide. Ohmic contacts are discussed in U.S. Pat. Nos. 5,323,022 and 5,409,859, the disclosures of which are incorporated herein by reference as if set forth in their entirety. An overlayer metal 106, such as gold, may be deposited on the ohmic contacts 130 and 131 as illustrated in FIG. 2.

As used herein the term "ohmic contact" refers to contacts where an impedance associated therewith is substantially given by the relationship of Impedance =V/I, where V is a voltage across the contact and I is the current, at substantially all expected operating frequencies (i.e., the impedance associated with the ohmic contact is substantially the same at all operating frequencies) and currents.

Figure 3A:
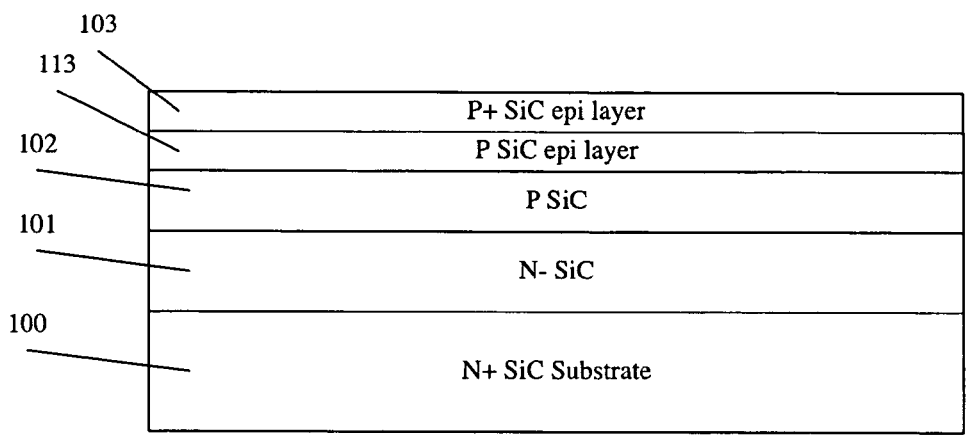
FIGS. 3A through 3J are cross sections illustrating processing steps in the fabrication of SiC BJTs according to some embodiments of the present invention.

Processing steps in the fabrication of BJTs according to some embodiments of the present invention will now be discussed with respect to the cross sections of FIGS. 3A through 7C. Referring now to FIG. 3A, a highly doped SiC substrate 100 having a first conductivity type, for example, n-type SiC ($N^+$), is formed. In some embodiments of the present invention, the substrate 100 may have a polytype of, for example, 3C, 2H, 4H, 6H or 15R. In some embodiments of the present invention, the substrate 100 may be doped during the growth phase with a donor dopant, such as nitrogen, at a concentration from about $1.0\times10^{18}$ $cm^{-3}$ to about $5\times10^{19}$ $cm^{-3}$. The substrate 100 may also have a thickness of from about 200 μm to about 500 μm.

A first epitaxial layer 101, having n-type conductivity (N) is formed on the substrate 100. The first epitaxial layer 101 is doped with a donor dopant, such as nitrogen, at a concentration of from about $1.0\times10^{13}$ $cm^{-3}$ to about $1.0\times10^{17}$ $cm^{-3}$. The first epitaxial layer 101 has a thickness of from about 1.0 μm to about 250 μm. The substrate 100 and the first epitaxial layer 101 define the collector region of the BJT according to some embodiments of the present invention. A second epitaxial layer 102 having p-type (P) conductivity is formed on first epitaxial layer 101. The second epitaxial layer 102 is doped with an acceptor dopant, such as aluminum or boron, at a concentration of from about $1.0\times10^{16}$ $cm^{-3}$ to about $1.0\times10^{19}$ $cm^{-3}$. The second epitaxial layer 102 has a thickness of from about 0.1 μm to about 10 cm. A third epitaxial layer 113 having p-type conductivity is formed on the second epitaxial layer 102. The third epitaxial layer 113 is more highly doped than the second epitaxial layer 102. In particular, the third epitaxial layer 113 is doped with an acceptor dopant, such as aluminum or boron, at a carrier concentration of from about $1.0\times10^{18}$ $cm^{-3}$ to about $1.0\times10^{19}$ $cm^{-3}$. The third epitaxial layer 113 has a thickness of from about 0.1 μm to about 10 μm. A fourth epitaxial layer 103 is formed on the third epitaxial layer 113 and is more highly doped than the third epitaxial layer. The fourth epitaxial layer 103 is doped with an acceptor dopant, such as aluminum or boron, at a concentration of from about $1.0\times10^{19}$ $cm^{-3}$ to about $5\times10^{20}$ $cm^{-3}$. The fourth epitaxial layer 103 has a thickness of from about 0.1 μm to about 3.0 μm.

Figure 3B:
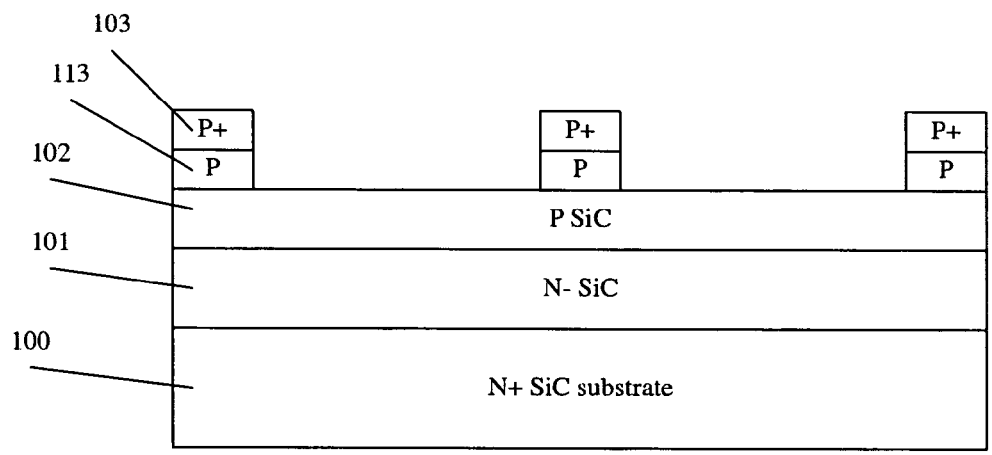

Referring now to FIG. 3B, regions of the third and fourth epitaxial layers 113 and 103 are isolated as mesas on the surface of the second epitaxial layer 102 using, for example, photolithographic techniques such as a patterned photoresist and subsequent etching to provide first and second p-type epitaxial SiC regions 113 and 103 of an epitaxial SiC base region (140 FIG. 2). According to some embodiments of the present invention, reactive ion etching of epitaxial layers may be implemented to define mesas for base and emitter contacts. For example, the epitaxial layers may be etched using reactive ion etching with nitrogen trifluoride ($NF_3$). $NF_3$ has demonstrated a number of advantages in silicon carbide etching processes. Reactive ion etching using $NF_3$ is discussed *Surface Characteristics of Monocrystalline Beta-SiC Dry Etched in Fluorinated Gases by Palmour* et al. (Mat. Res. Soc. Symp. Proc., Vol. 76, 1987, p. 185), the disclosure of which is incorporated herein by reference as if set forth in its entirety. Techniques for etching silicon carbide are also discussed in U.S. Pat. Nos. 4,865,685 and 4,981,551 to Palmour, the disclosures of which are incorporated herein by reference as if set forth in their entirety.

The third and fourth epitaxial layers 113 and 103 may be etched until at least a portion the surface of the second epitaxial layer 102 is exposed. For example, some embodiments of the present invention provide a 0.4 μm mesa of third and fourth epitaxial layers 113 and 103. In these embodiments of the present invention, an electrical check from front to back may determine when the etching process should be terminated. This step may then be followed by an overetch, for example, a 15 percent overetch. The second epitaxial layer 102 and the epitaxial SiC base region 140 including the first p-type epitaxial SiC region 113 and the second p-type epitaxial SiC region 103 may define the base region of the BJT according to some embodiments of the present invention.

Figure 3C:
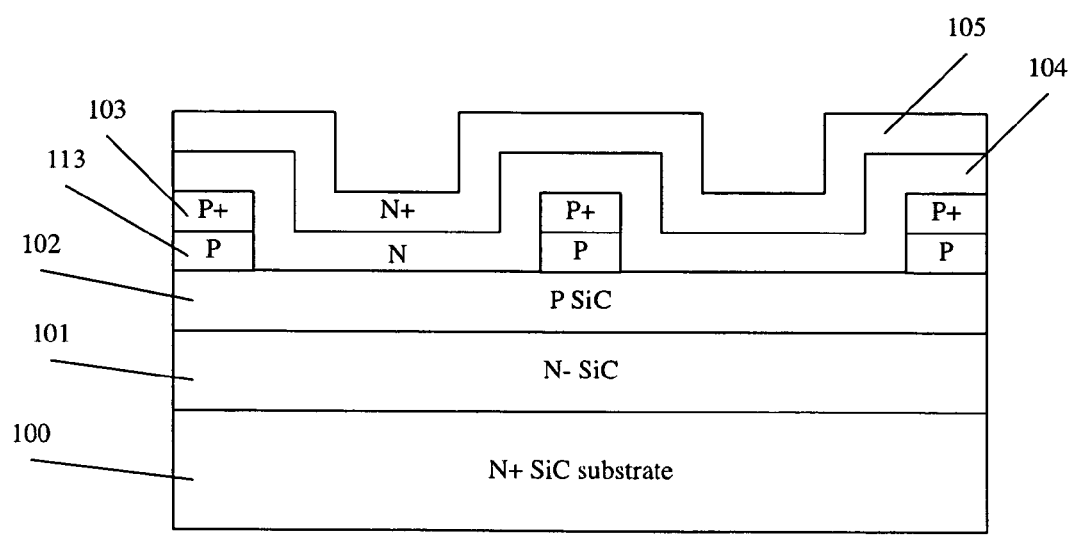

Referring now to FIG. 3C, a fifth epitaxial layer 104 of n-type conductivity may be re-grown on the surface of the second epitaxial layer 102 and the first and second p-type epitaxial SiC regions 113 and 103. The fifth epitaxial layer 104 is doped with a donor dopant, such as nitrogen, at a concentration of from about $1.0\times10^{17}$ $cm^{-3}$ to about $5\times10^{19}$ $cm^{-3}$. The fifth epitaxial layer 104 has a thickness of from about 0.1 μm to about 5 μm. A sixth epitaxial layer 105, having a higher carrier concentration relative to the fifth epitaxial layer 104, is grown on the fifth epitaxial layer 104. The sixth epitaxial layer 105 is doped with a donor dopant, such as nitrogen, at a concentration of from about $5\times10^{18}$ $cm^{-3}$ to about $5\times10^{20}$ $cm^{-3}$. The sixth epitaxial layer 105 has a thickness of from about 0.1 μm to about 3 μm.

Figure 3D:
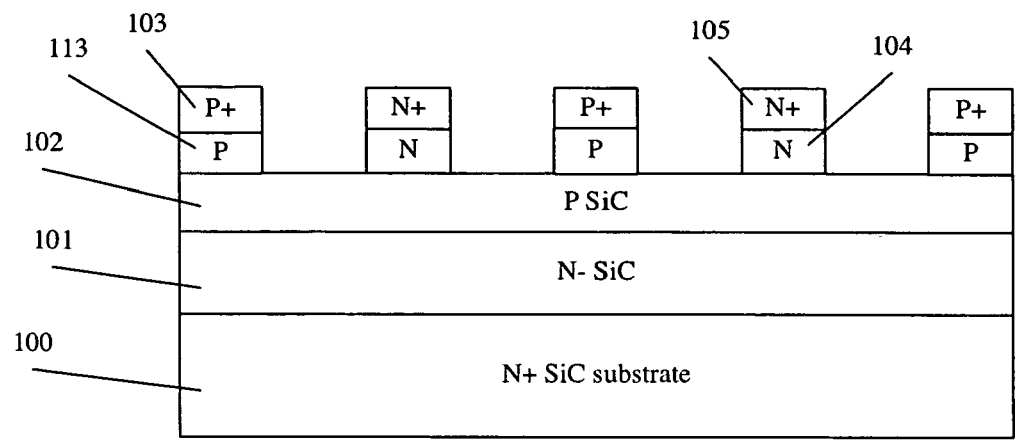

Referring now to FIG. 3D, regions of the fifth and sixth epitaxial layers 104 and 105 are isolated as mesas on the surface of the second epitaxial layer 102 using, for example, a patterned photoresist and subsequent etching as discussed with respect to FIG. 3B to provide first and second portions 104 and 105 of an epitaxial SiC emitter region (145 FIG. 2). Again, the fifth and sixth epitaxial layers 104 and 105 are etched until at least a portion of the surface of the second epitaxial layer 102 is exposed. The first and second portions 104 and 105 define the emitter region of the BJT according to some embodiments of the present invention.

Figure 3E:
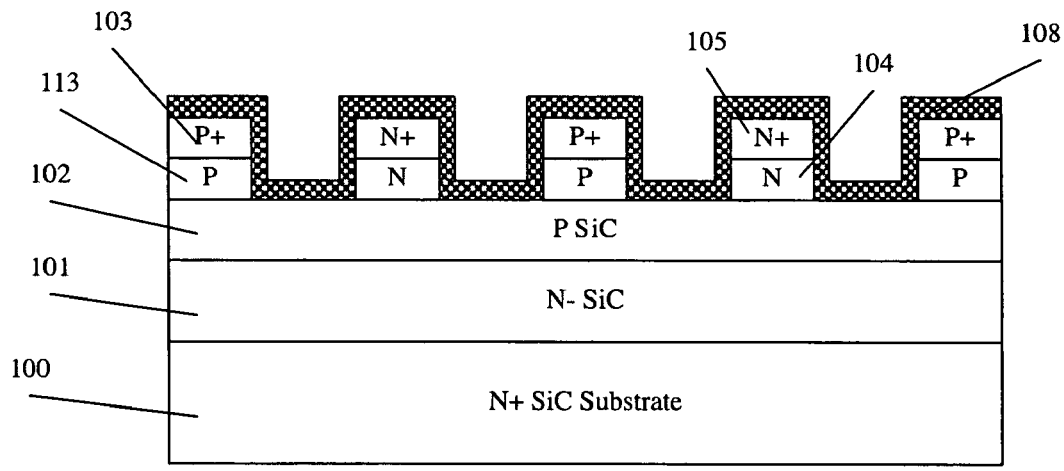
Figure 3F:
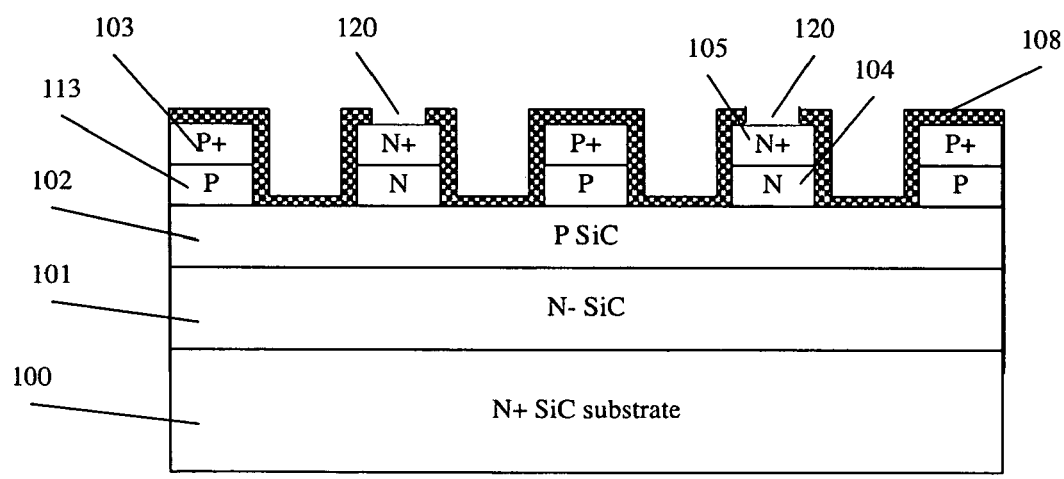

Referring now to FIG. 3E, a passivation layer 108 is formed on the surface of the second epitaxial layer 102, the first and second p-type epitaxial SiC regions 113 and 103 and the first and second portions 104 and 105 of the emitter region. The passivation layer 108 may include, for example, thermally grown $SiO_2$, chemical vapor deposited $SiO_2$ and/or chemical vapor deposited $Si_3N_4$. As illustrated in FIG. 3F, windows 120 may be opened in the passivation layer 108 by, for example, selectively etching the passivation layer 108. The passivation is etched until at least a portion of the surface of the second portion 105 of the emitter region is exposed.

Figure 3G:
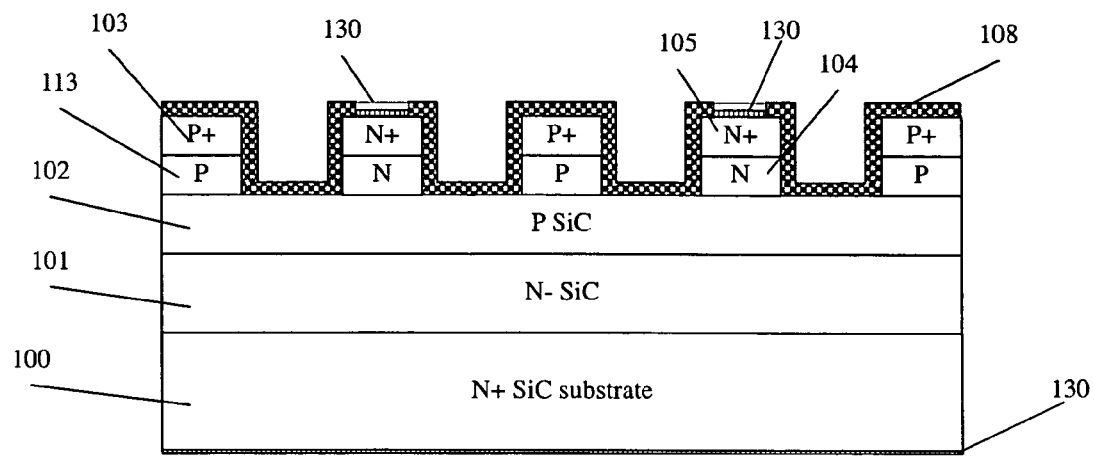

Referring now to FIG. 3G, ohmic metal 130, suitable for n-type silicon carbide, is deposited on the exposed surfaces of the second portion 105 of the emitter region for emitter fabrication. The ohmic metals may be deposited using, for example, e-beam evaporation and the ohmic metals may be annealed at high temperatures, for example, temperatures from about 625° C. to about 1000° C. to provide ohmic contacts. A wet etch may be performed to remove unreacted metal. In some embodiments of the present invention, the substrate 100 is a conductive substrate. In these embodiments of the present invention, an ohmic metal 130 is also deposited on the backside of substrate 100 for collector fabrication. It will be understood by those skilled in the art that embodiments of the present invention are not limited to conductive substrates. For example, in some embodiments of the present invention, the substrate may be a non-conducting substrate, such as semi-insulating silicon carbide or sapphire, in which case ohmic metal 130 for collector formation may be provided on a surface of the first epitaxial n-type layer 101.

Figure 3H:
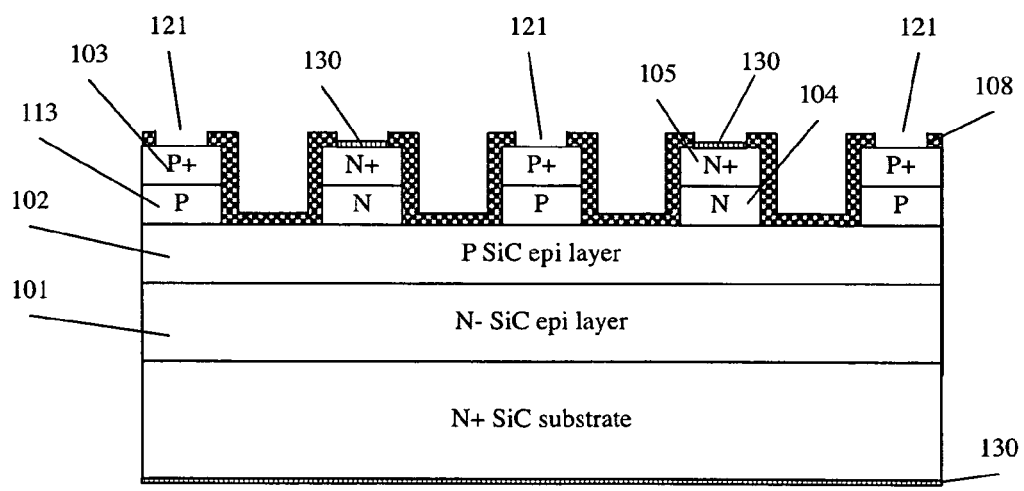
Figure 3I:
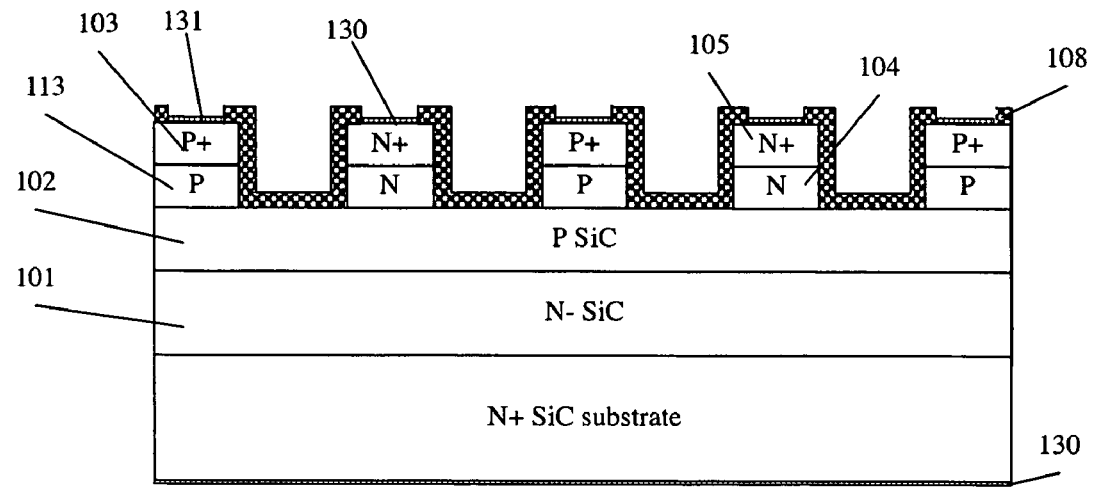
Figure 3J:
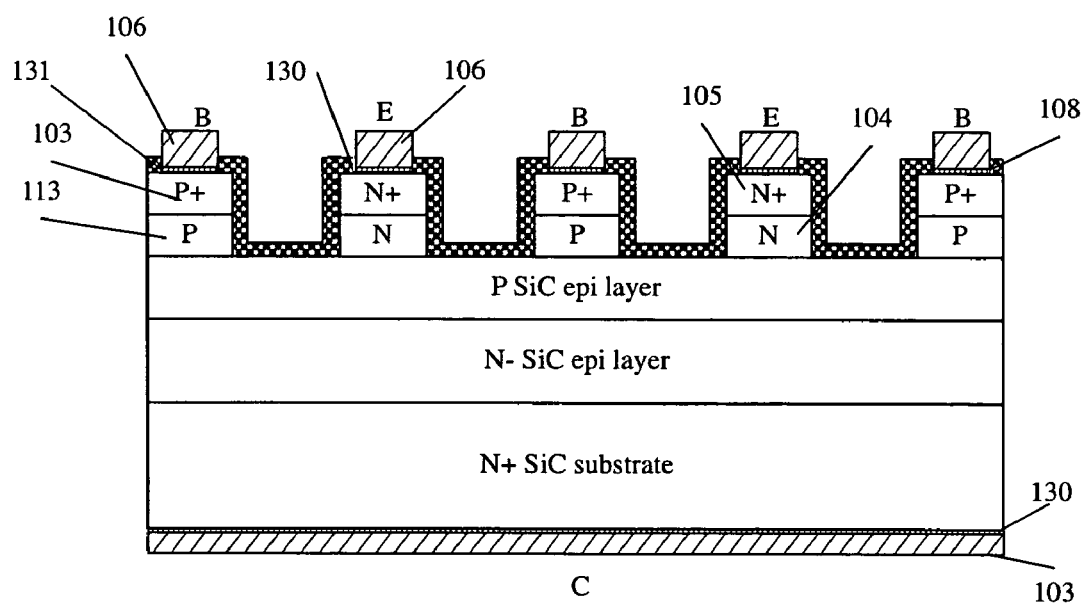

Referring now to FIG. 3H, windows 121 may be opened in the passivation layer 108 by, for example, selectively etching the passivation layer 108. The passivation layer 108 may be etched until at least a portion of the surface of the second p-type epitaxial SiC region 103 is exposed. As illustrated in FIG. 3I, ohmic metal 131, suitable for p-type silicon carbide, is deposited on exposed surfaces of the second p-type epitaxial SiC region 103 for base fabrication. BJTs according to some embodiments of the present invention are illustrated in, for example, FIG. 3J. As illustrated therein, an overlayer metal 106, such as gold, may be formed on the ohmic contacts 130 and 131.

It will be understood that although embodiments of the present invention discussed above with respect to FIGS. 2 and 3A through 3J include a multilevel base region, embodiments of the present invention are not limited to this configuration. For example, as illustrated in FIG. 4, the base region 423 in these embodiments is a single layer of p-type silicon carbide. The single P+ layer 423 is doped with an acceptor dopant, such as aluminum or boron, at a concentration of from about $1.0 \times 10^{18}$ cm$^{-3}$ to about $5 \times 10^{20}$ cm$^{-3}$ and has a thickness of from about 0.1 μm to about 10 μm. The single P+ layer 423 may be uniformly doped or may have a graded doping concentration, such that the doping concentration increases the farther it is away from the second epitaxial layer 102.

Figure 5A:
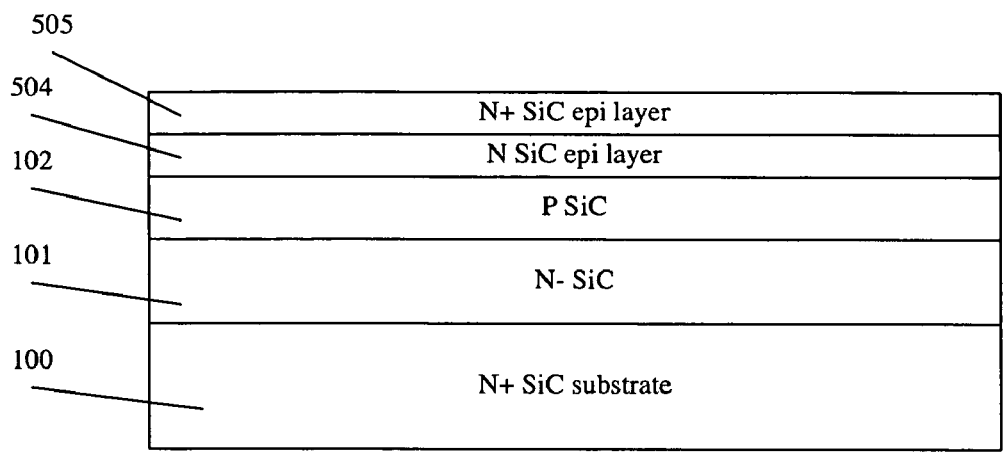
FIGS. 5A through 5C are cross sections illustrating processing steps in the fabrication of SiC BJTs according to further embodiments of the present invention.

Processing steps in the fabrication of BJTs according to some embodiments of the present invention will now be discussed with respect to the cross sections illustrated in FIGS. 5A through 5C. Referring first to FIG. 5A, processing steps in the fabrication of the substrate 100, first epitaxial layer 101 and second epitaxial layer 102 are similar to the processing steps of like numbered elements discussed with respect to FIG. 3A and, therefore, details with respect to the processing steps of these elements will not be repeated herein. A third epitaxial layer 504 having an n-type conductivity is grown on the second epitaxial layer 103. A fourth epitaxial layer 505, having higher n-type conductivity relative to the third epitaxial layer 504, is grown on the third epitaxial layer 504. The third and fourth epitaxial layers 504 and 505 define an emitter region of the BJT.

Figure 5B:
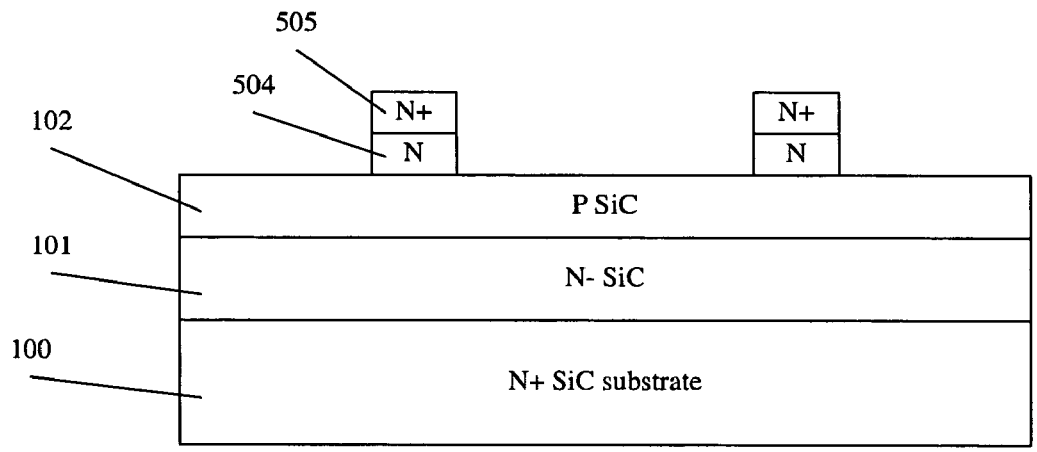

Referring now to FIG. 5B, regions of the third and fourth epitaxial layers 504 and 505 are isolated on the surface of the second epitaxial layer 102 using, for example, photolithographic techniques as a patterned photoresist and subsequent etching. The third and fourth epitaxial layers 504 and 505 are etched until at least a portion of the second epitaxial layer 102 is exposed.

Figure 5C:
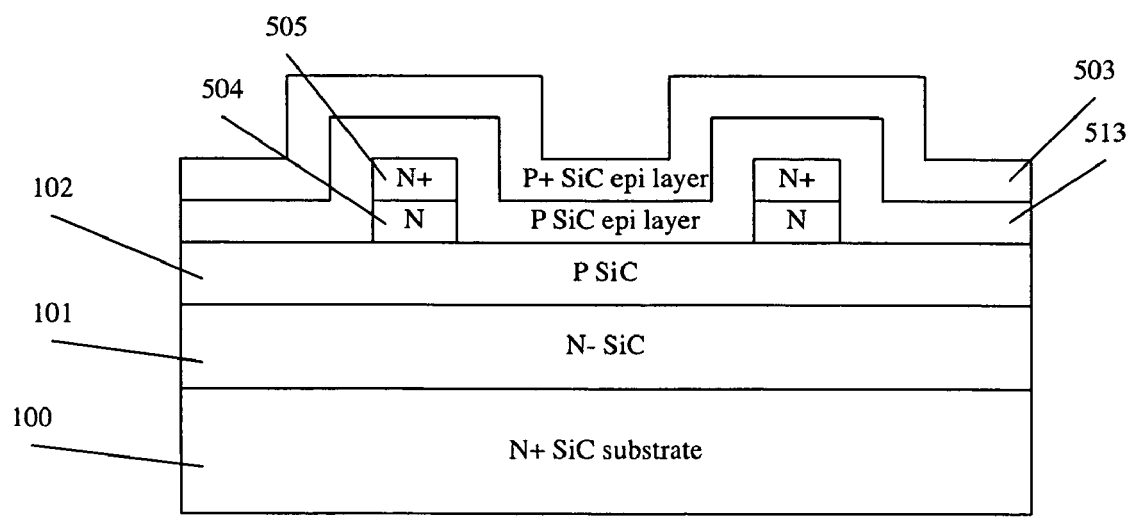

Referring now to FIG. 5C, fifth and sixth epitaxial layers 513 and 503 of p-type conductivity are re-grown on the surface of the second epitaxial layer 102 and the first and second portions 504 and 505 of the emitter region. The sixth epitaxial layer 503 is more highly doped relative to the fifth epitaxial layer 513. Furthermore, the fifth epitaxial layer 513 is more highly doped than the second epitaxial layer 102. The device illustrated in FIG. 5C is etched to isolate regions of epitaxial layers 513 and 503. The fifth and sixth epitaxial layers 513 and 503 are etched until at least a portion of the surface of second epitaxial layer 102 is exposed. The second epitaxial layer 102 and isolated layers 513 and 503 define the base region of the BJT (FIG. 3D). Thus, embodiments of the present invention illustrated in FIGS. 5A through 5C illustrate that the emitter portions 504 and 505 may be formed before the first and second layers 513 and 503 of the base region without departing from the scope of the present invention. Processing steps in the fabrication of the remaining portions of the BJT according to some embodiments of the present invention are similar to those discussed above with respect to FIGS. 3E-3J and, therefore, will not be repeated herein.

Figure 6A:
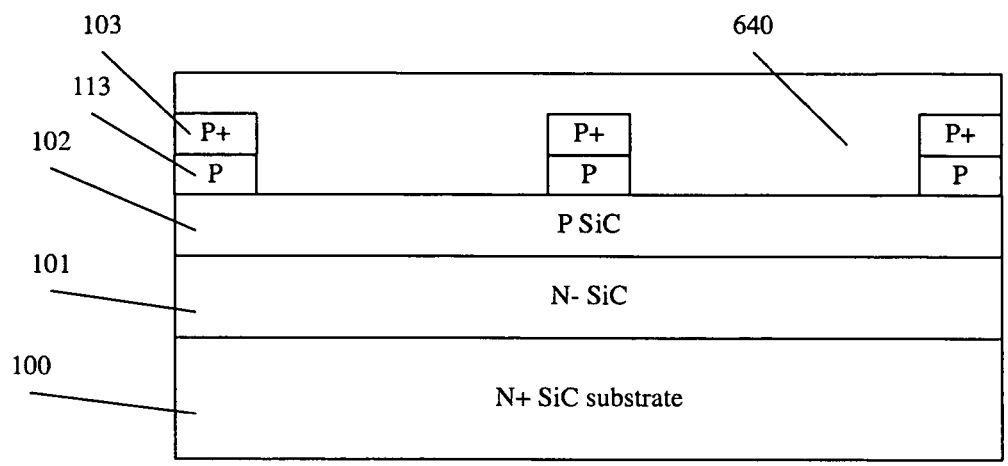
FIGS. 6A through 6C are cross sections illustrating processing steps in the fabrication of SiC BJTs according to still further embodiments of the present invention.

Processing steps in the fabrication of BJTs according to some embodiments of the present invention will now be discussed with respect to FIGS. 6A-6C. Referring first to FIG. 6A, the processing steps in the fabrication of the substrate 100, first epitaxial layer 101, the second epitaxial layer 102, the first SiC region 113 and the second SiC region 103 are similar to processing steps of the like numbered elements discussed with respect to FIG. 3A and, therefore, details with respect to the processing steps of these elements will not be repeated herein. As illustrated in FIG. 6A, a masking layer 640 is deposited on the surface of the second epitaxial layer 102 and the first and second regions of SiC 113 and 103. The masking layer 640 may include, for example, $SiO_2$, $Si_3N_4$, tantalum carbide (TaC), or any other similar material capable of withstanding an epitaxial growth temperature of about 1600° C. for about 30 minutes and can subsequently be removed.

Figure 6B:
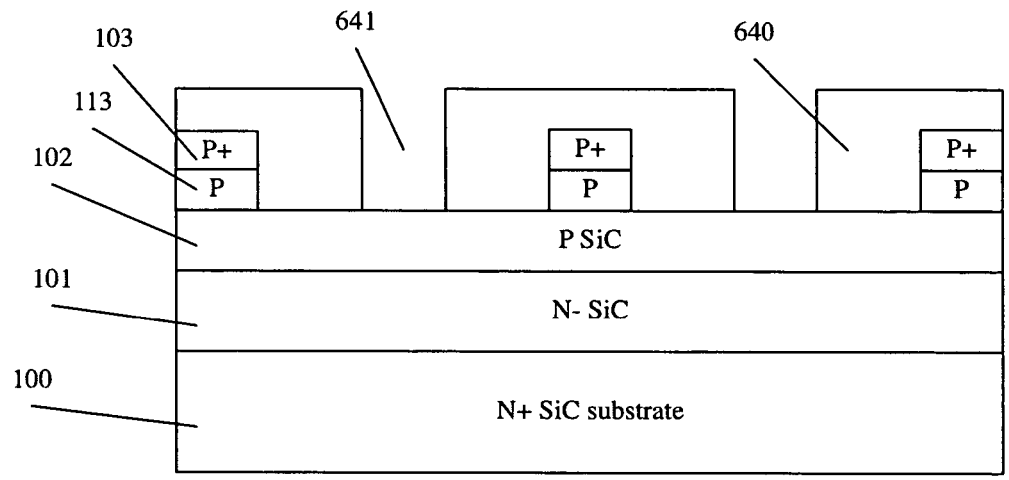
Figure 6C:
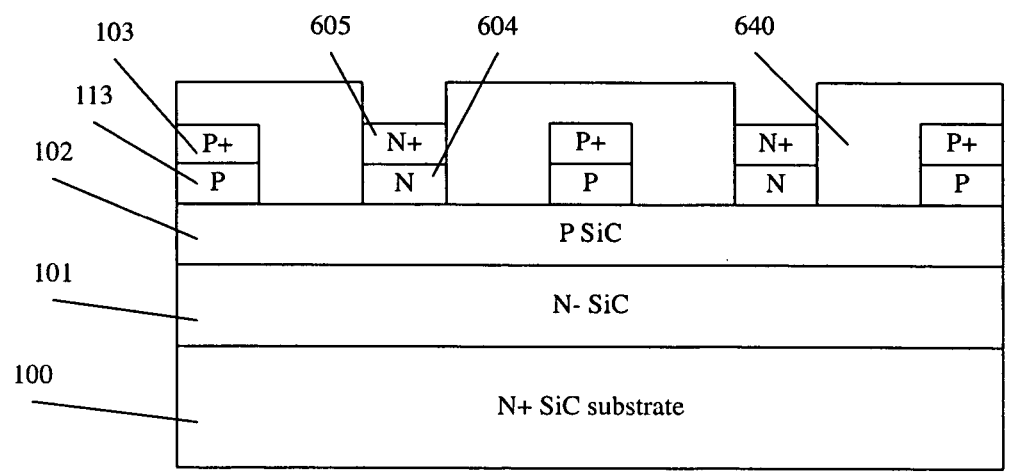

Referring now to FIG. 6B, window 641 are formed in masking layer 640 by, for example, selective etching. As illustrated in FIG. 6C, a first epitaxial layer 604 having n-type conductivity and a second epitaxial layer 605 having a higher n-type conductivity relative to the first epitaxial layer 604 are formed in the windows 641 to form the emitter region of the BJT. The remaining masking layer 640 is removed to provide an intermediate device similar to the device illustrated in FIG. 3D. Processing steps in the fabrication of the remaining portions of the BJT according to some embodiments of the present invention are similar to those discussed above with respect to FIGS. 3E-3J and, therefore, will not be repeated herein.

Figure 7A:
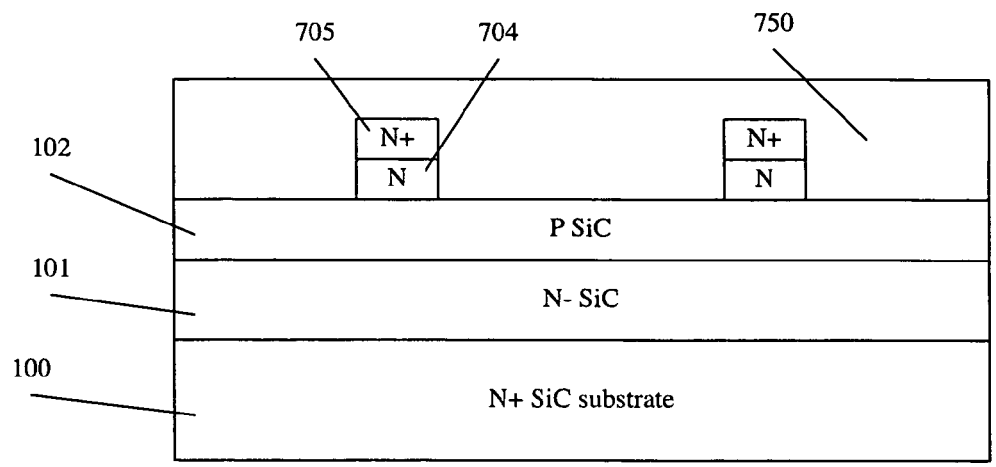
FIGS. 7A through 7C are cross sections illustrating processing steps in the fabrication of SiC BJTs according to some embodiments of the present invention.

Processing steps in the fabrication of BJTs according to some embodiments of the present invention will now be discussed with respect to FIGS. 7A through 7C. As illustrated in FIG. 7A, the processing steps in the fabrication of the substrate 100, first epitaxial layer 101, the second epitaxial layer 102, and the first and second portions 104 and 105 of the emitter region are similar to processing steps of the like numbered elements discussed with respect to FIGS. 3A through 3D and, therefore, details with respect to the processing steps of these elements will not be repeated herein. As further illustrated in FIG. 7A, a masking layer 750 is provided on the surface of the second epitaxial layer 102 and the first and second portions 704 and 705. The masking layer 750 may include, for example, silicon dioxide ($SiO_2$), TaC, and the like.

Figure 7B:
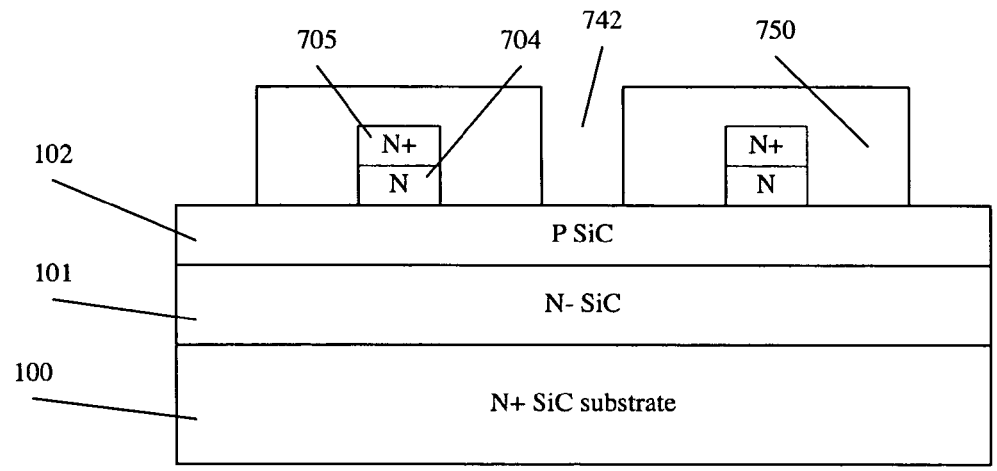
Figure 7C:
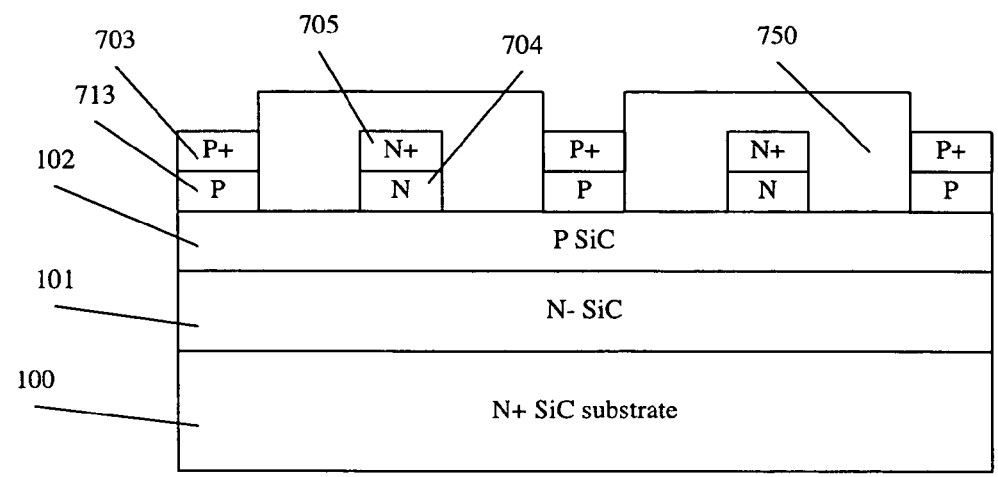

As illustrated in FIG. 7B, windows 742 may be opened in masking layer 750 by, for example, selective etching. As illustrated in FIG. 7C, epitaxial layers 713 and 703 having p-type conductivities are formed in the windows 742 and together with layer 102 form the base region of the BJT. The remaining masking layer 750 is removed to provide an intermediate device similar to the device illustrated in FIG. 3D. Thus, FIGS. 7A through 7C are provided to illustrate that either the emitter region or the base region of the BJT may be formed using the processes discussed in FIGS. 6A through 6C and 7A through 7C. Processing steps in the fabrication of the remaining portions of the BJT according to some embodiments of the present invention are similar to those discussed above with respect to FIGS. 3E-3J and, therefore, will not be repeated herein.

Various experimental output characteristics of conventional SiC BJTs and SIC BJTs according to some embodiments of the present invention will now be discussed with respect to FIGS. 9 through 16. It will be understood that these performance characteristics are based on experimental data and, therefore, embodiments of the present invention are not limited by the examples discussed herein.

1200 V,10 A BJTs were tested for stability. NPN BJTs were fabricated in 4H-SiC with a 14 µm thick n-type collector layer doped at $4.8 \times 10^{15}$ $cm^{-3}$, a 1.0 µm thick p-type base layer doped at $2 \times 10^{17}$ $cm^{-3}$ and 2.0 µm thick n-type emitter layer doped at $3.0 \times 10^{19}$ $cm^{-3}$. A simplified BJT structure is illustrated a cross section of the 4H-SiC BJT of FIG. 9. The device of FIG. 9 has a pitch of 25.0 µm. The chip size is 1.88 mm×1.88 mm with a total emitter width of 62 mm and an active area of 0.0225 $cm^2$, as illustrated in the plan view of the SiC BJT of FIG. 10. The details with respect to the fabrication of such devices are discussed in, for example, *ISPSD Proceedings* (2005), p. 271 by Agarwal et al. and IEEE Electron Device Letters Vol. 26, No. 3 (2005), p. 175 by Krishnaswami et al., the disclosures of which are hereby incorporated herein by reference as if set forth in their entirety.

The DC output characteristics of one of the devices in common emitter mode are illustrated in FIGS. 11A through 11D, before and after many hours of stress at a collector current of 10 A. In particular, a SiC BJT having the conventional structure shown in FIG. 1 was operated at 10.0 A over various time intervals, i.e., 0 minutes (FIG. 9A), 15 minutes (FIG. 9B), 30 minutes (FIG. 9C) and 16 hours (FIG. 9D). The device was packaged in a metal package. After the initial measurement, the device was stressed at 10 A for a given amounts of time. The device was powered down, allowed to cool and then the output characteristics were recorded. As illustrated in FIGS. 11A through 11D, both the current gain and the on-resistance may be reduced over time. Accordingly, conventional SiC BJTs show instability in the I-V characteristics after as little as 15 minutes of operation. The dislocations created by the $p^+$ implant 25 of the conventional BJT of FIG. 1 may be responsible for the deterioration of the device characteristics.

The current gain reduces, the on-resistance in saturation increases, and the slope of the output characteristics in the active region increases. This degradation in the I-V characteristics may continue with many hours of operation. This phenomenon, which may be caused by the Basal Plane Dislocations which may arise during the epitaxial growth of various layers, has been discussed in U.S. Patent Application Ser. No. 60/554,123 filed Mar. 18, 2004 to Hallin et al., corresponding to PCT Application No. PCT/US2005/004473, filed on Feb. 14, 2005, entitled LITHOGRAPHIC METHODS TO REDUCE STACKING FAULT NUCLEATION SITES AND STRUCTURES HAVING REDUCED STACKING FAULT NUCLEATION SITES, assigned to the assignee of the present invention, the disclosure of which is hereby incorporated herein by reference as if set forth in its entirety. Stacking fault growth within the base layer may be observed by light emission imaging. The energy for this expansion of the stacking fault may come from the electron-hole recombination in the forward biased base-emitter junction. This may result in reduction of the effective minority carrier lifetime, increasing the electron-hole recombination in the base in the immediate vicinity of the stacking fault, which may lead to a reduction in the current gain.

Figure 11A:
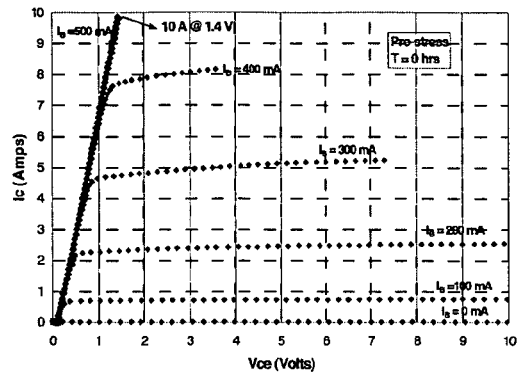
FIGS. 11A through 11D are graphs illustrating current gain drifts over time of conventional SiC BJTs.
Figure 11B:
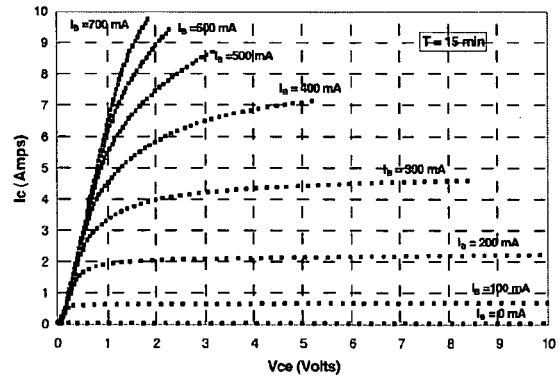
Figure 11C:
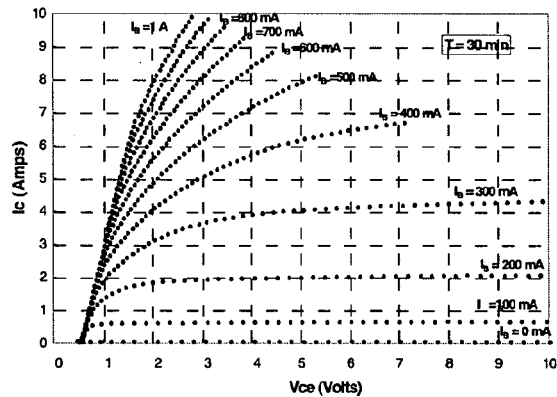
Figure 11D:
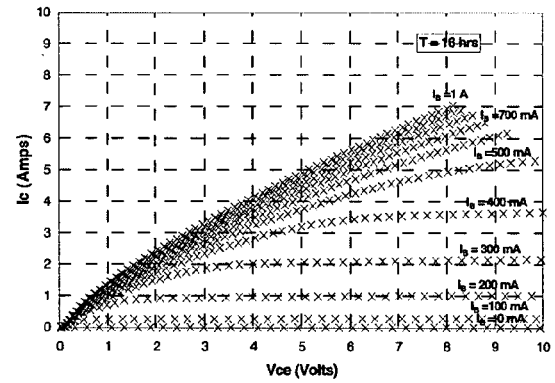
Figure 12:
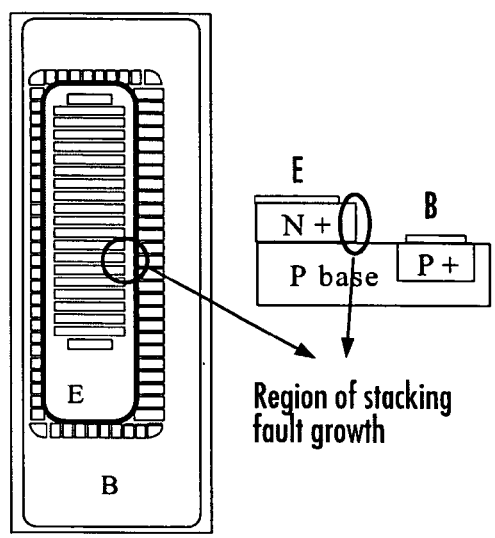
FIG. 12 is a diagram illustrating the layout and structure of gridded BJTs used for stacking fault detection and growth.

The following additional observations can be made from data shown in FIGS. 11A through 11D. First, the initial DC current gain was approximately 30 (FIG. 11A), which was reduced to about 15 after 16 hrs of stress. Thus, about a 50 percent reduction in DC current gain was shown (FIG. 11D). Second, the on-resistance in saturation increased substantially, and third, the slope of the curves in the active region increased as a result of the electrical stress. Similar behavior was observed on a large number of devices. Since the active area was covered with metal, it was difficult to see what was happening in the active area. Accordingly, a simple BJT structure was designed with windows in the active area, which allowed the electroluminescence at the edge of the emitter where most of the current is confined, as well as under the emitter, to be imaged. The layout structure of a gridded BJT used for stacking fault detection and growth is illustrated in FIG. 12.

Figure 13A:
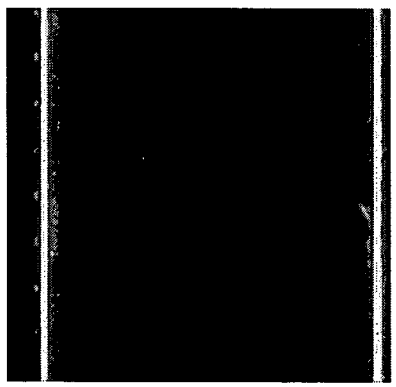
FIGS. 13A through 13C are pictures of the BJT structure.
Figure 13B:
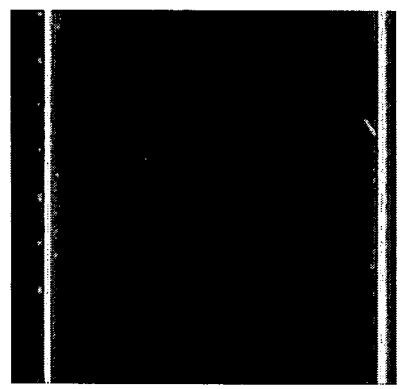
Figure 13C:
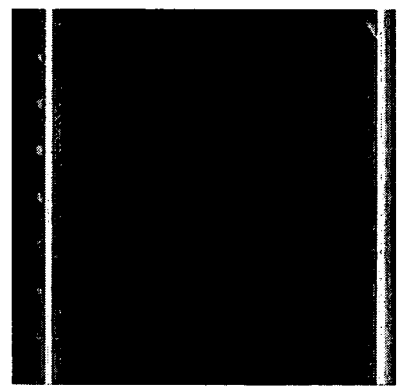
Figure 14:
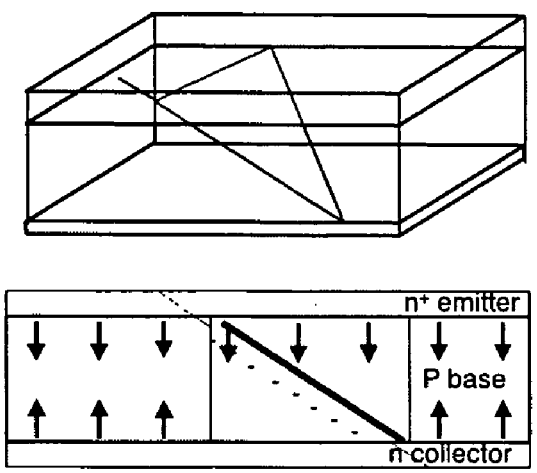
FIG. 14 is a diagram illustrating aspects of BJTS.
Figure 15:
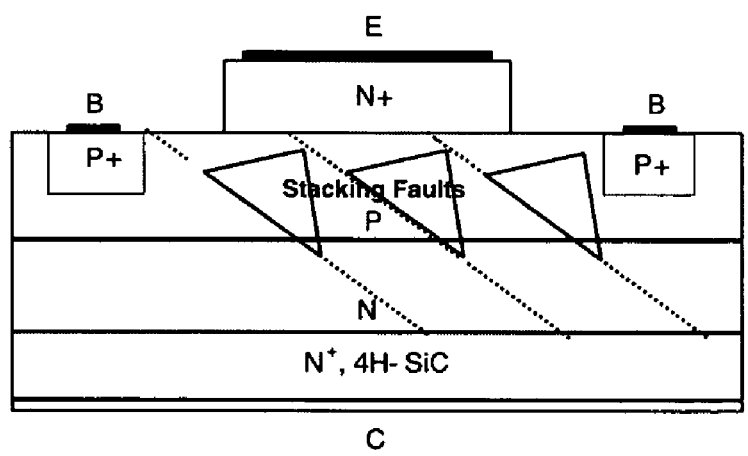
FIG. 15 is a diagram illustrating stacking faults in the base of a BJT.

Successive images, 10 seconds apart, were taken while the device was under stress ($I_C$=50 mA, $I_B$=3 mA). Three such frames (50 seconds apart) are illustrated in FIGS. 13A (t), 13B (t+50s) and 13C (t+100s). The arrows point to the partial dislocations that bound the stacking faults. Three stacking faults are present. The fault labeled 1 is at the high current region near the edge of the emitter and its expansion is evident. Stacking faults 2 and 3 lie under the emitter in a much lower current region and it does not noticeably grow during the 100 sec interval.

Based on these observations, the reduction in the current gain of SiC BJTs may be explained based on what has been previously observed in SiC pn junction diodes. Details with respect to SiC junction diodes are discussed in, for example, Material Science. Forum Vol. 353-356 (2001), p. 727 by Lendenmann et al., Applied Physics. Letters 81 (2002), p. 883 by Galeckas et al. and Material Science Forum Vol. 457-460 (2004), p. 1113 by Sumakeris et al., the disclosures of which are hereby incorporated herein by reference as if set forth in their entirety.

In particular, an increase in the forward voltage ($V_f$) of SiC pn diodes was reported. This $V_f$ increase was explained by the growth of stacking faults from certain basal plane dislocations within the drift layer of the PiN diode. The energy for this expansion of the stacking fault comes from the electron-hole recombination in the conductivity modulated drift layer. This may result in reduction of the minority carrier lifetime, reducing the conductivity modulation in the immediate vicinity of the stacking fault, leading to an increase in $V_f$. Accordingly, a similar phenomenon may be taking place in the SiC BJT device. The base of the transistor is flooded with electron-hole pairs during operation as illustrated in, for example, FIG. 14. The recombination of electron-hole pairs in the base may give rise to stacking faults as pictorially illustrate in FIG. 15. These stacking faults may reduce the lifetime of the minority carriers locally in the base, which in turn may result in reduced current gain. The reduction in current gain may also explain the increase in the on-resistance of the BJT in the saturation region since not many carriers make it across the base into the collector. The increase in the slope of the I-V curves in the linear region indicates that the base doping has been effectively reduced, resulting in an enhanced "Early Effect." This could also be the consequence of the generated stacking faults in the base.

Figure 16:
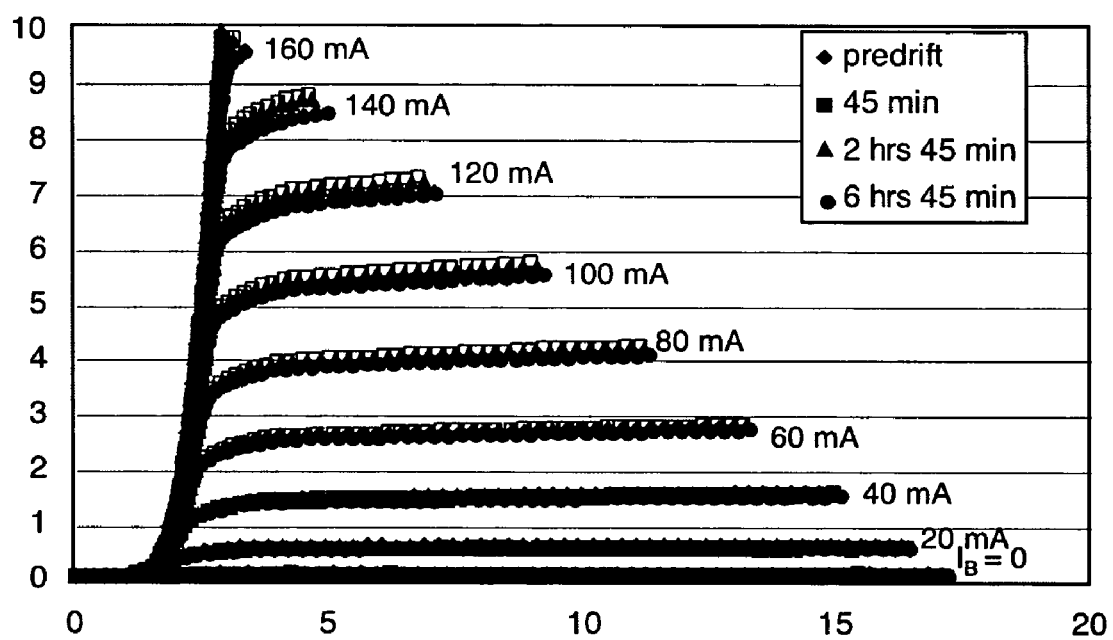
FIG. 16 is a graph illustrating I-V characteristics obtained according to some embodiments of the present invention.

Referring now to FIG. 16, output characteristics of SiC BJTs according to some embodiments of the present invention illustrated in FIG. 8 will now be discussed. FIG. 16 illustrates exemplary I-V characteristics obtained with the structure shown in FIG. 16 according to some embodiments of the present invention. Four traces of the output characteristics of a SiC BJT according to some embodiments of the present invention with increasing stress exhibits relatively small drift in current gain. Accordingly, the current gain drift and the reduction in the on-resistance may be suppressed according to some embodiments of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A bipolar junction transistor (BJT) comprising:
a silicon carbide (SiC) substrate;
an epitaxial SiC base region on the SiC substrate, the epitaxial SiC base region having a first conductivity type; and
an epitaxial SiC emitter region on the SiC substrate, the epitaxial SiC emitter region having a second conductivity type, different from the first conductivity type, and having a first portion on the SiC substrate and a second portion on the first portion remote from the SiC substrate, the second portion having a higher carrier concentration than the first portion, wherein the epitaxial SiC base region comprises:
a first p-type epitaxial SiC layer on the SiC substrate;
a first p-type epitaxial SiC region on the first p-type epitaxial SiC layer, the first p-type epitaxial SiC region having a higher carrier concentration than the first p-type epitaxial SiC layer; and
a second p-type epitaxial SiC region on the first p-type epitaxial SiC region remote from the first p-type epitaxial SiC layer, the second p-type epitaxial SiC region having a higher carrier concentration than the first p-type epitaxial SiC region.

2. The BJT of claim 1:
wherein the first p-type epitaxial SiC layer has a carrier concentration of from about $1.0 \times 10^{19}$ cm$^{-3}$ to about $1.0 \times 10^{19}$ cm$^{-3}$ and a thickness of from about 0.1 µm to about 10 µm;
wherein the first p-type epitaxial SiC region has a carrier concentration of from about $1.0 \times 10^{19}$ cm$^{-3}$ to about $1.0 \times 10^{19}$ cm$^{-3}$ and has a thickness of from about 0.1 µm to about 10 µm; and
wherein the second p-type epitaxial SiC region has a carrier concentration of from about $1.0 \times 10^{19}$ cm$^{-3}$ to about $5 \times 10^{20}$ cm$^{-3}$ and has a thickness of from about 0.1 µm to about 3.0 µm.

3. A bipolar junction transistor (BJT) comprising:
a silicon carbide (SiC) substrate,
an epitaxial SiC base region on the SiC substrate, the epitaxial SiC base region having a first conductivity type; and
an epitaxial SiC emitter region on the SiC substrate, the epitaxial SiC emitter region having a second conductivity type, different from the first conductivity type, and having a first portion on the SiC substrate and a second portion on the first portion remote from the SiC substrate, the second portion having a higher carrier concentration than the first portion, wherein the epitaxial SiC base region comprises:
a first p-type epitaxial SiC layer on the SiC substrate; and
a p-type epitaxial SiC region on the first p-type epitaxial SiC layer remote from the SiC substrate, the p-type epitaxial SiC region having a higher carrier concentration than the first p-type epitaxial SiC layer.

4. The BJT of claim 3:
wherein the first p-type epitaxial SiC layer has a carrier concentration of from about $1.0 \times 10^{16}$ cm$^{-3}$ to about $1.0 \times 10^{19}$ cm$^{-3}$ and a thickness of from about 0.1 µm to about 10 µm; and
wherein the p-type epitaxial SiC region has a carrier concentration of from about $1.0 \times 10^{18}$ cm$^{-3}$ to about $5 \times 10^{20}$ cm$^{-3}$ and has a thickness of from about 0.1 µm to about 10 µm.

5. The BJT of claim 1:
wherein the first portion of the epitaxial SiC emitter region comprises n-type SiC having a carrier concentration of from about $1.0 \times 10^{17}$ cm$^{-3}$ to about $5 \times 10^{19}$ cm$^{-3}$ and has a thickness of from about 0.1 µm to about 5 µm; and
wherein the second portion of the epitaxial SiC emitter region comprises n-type SiC having a carrier concentration of from about $5 \times 10^{18}$ cm$^{-3}$ to about $5 \times 10^{20}$ cm$^{-3}$ and has a thickness of from about 0.1 µm to about 3.0 µm.

6. The BJT of claim 1, further comprising:
a first layer of SiC having the second conductivity type on the SiC substrate between the SiC substrate and the epitaxial SiC base region; and
a second layer of SiC having the first conductivity type on the first layer of SiC, wherein the epitaxial SiC base region and the epitaxial SiC emitter region are on the second layer of SiC, remote from the first layer of SiC.

7. The BJT of claim 6, wherein the first conductivity type is p-type conductivity SiC and the second conductivity type is n-type conductivity SiC.

8. The BJT of claim 7, wherein the first layer of SiC has a carrier concentration of from about $1.0 \times 10^{13}$ cm$^{-3}$ to about $1.0 \times 10^{17}$ cm$^{-3}$ and a thickness of from about 1.0 µm to about 250 µm.

9. A method of forming a bipolar junction transistor (BJT) comprising:

forming an epitaxial SiC base region on a SiC substrate, the epitaxial SiC base region having a first conductivity type; and forming an epitaxial SiC emitter region on the SiC substrate, the epitaxial SiC emitter region having a second conductivity type, different from the first conductivity type, and having a first portion on the SiC substrate and a second portion on the first portion remote from the SiC substrate, the second portion having a higher carrier concentration than the first portion, wherein forming the epitaxial SiC base region comprises:

forming a first p-type epitaxial SiC layer on the SiC substrate;

forming a first p-type epitaxial SiC region on the first p-type epitaxial SiC layer, the first p-type epitaxial SiC region having a higher carrier concentration than the first p-type epitaxial SiC layer; and forming a second p-type epitaxial SiC region on the first p-type epitaxial SiC region, the second p-type epitaxial SiC region having a higher carrier concentration than the first p-type epitaxial SiC region.

10. The method of claim 9:

wherein the first p-type epitaxial SiC layer has a carrier concentration of from about $1.0 \times 10^{16}$ cm$^{-3}$ to about $1.0 \times 10^{19}$ cm$^{-3}$ and a thickness of from about 0.1 μm to about 110 μm;

wherein the first p-type epitaxial SiC region has a carrier concentration of from about $1.0 \times 10^{18}$ cm$^{-3}$ to about $1.0 \times 10^{19}$ cm$^{-3}$ and has a thickness of from about 0.1 μm to about 10 μm; and wherein the second p-type epitaxial SiC region has a carrier concentration of from about $1.0 \times 10^{19}$ cm$^{-3}$ to about $5 \times 10^{20}$ cm$^{-3}$ and has a thickness of from about 0.1 μm to about 3.0 μm.

11. The method of claim 9, wherein forming the epitaxial SiC base region comprises:

forming a first p-type epitaxial SiC layer on the SiC substrate; and forming a p-type epitaxial SiC region on the first p-type epitaxial SiC layer remote from the SiC substrate, the p-type epitaxial SiC region having a higher carrier concentration than the first p-type epitaxial SiC layer.

12. The method of claim 11:

wherein the first p-type epitaxial SiC layer has a carrier concentration of from about $1.0 \times 10^{16}$ cm$^{-3}$ to about $1.0 \times 10^{19}$ cm$^{-3}$ and a thickness of from about 0.1 μm to about 10 μum; and wherein the p-type epitaxial SiC region has a carrier concentration of from about $1.0 \times 10^{18}$ cm$^{-3}$ to about $5 \times 10^{20}$ cm$^{-3}$ and has a thickness of from about 0.1 μm to about 10 μm.

13. The method of claim 9:

wherein the first portion of the epitaxial SiC emitter region comprises n-type SiC having a carrier concentration of from about $1.0 \times 10^{17}$ cm$^{-3}$ to about $5 \times 10^{19}$ cm$^{-3}$ and has a thickness of from about 0.1 μm to about 5 μm; and wherein the second portion of the epitaxial SiC emitter region comprises n-type SiC having a carrier concentration of from about $5 \times 10^{18}$ cm$^{-3}$ to about $5 \times 10^{20}$ cm$^{-3}$ and has a thickness of from about 0.1 μm to about 3.0 μm.

14. A method of forming a bipolar junction transistor (BJT) comprising:

forming an epitaxial SiC base region on a SiC substrate, the epitaxial SiC base region having a first conductivity type; and forming an epitaxial SiC emitter region on the SiC substrate the epitaxial SiC emitter region having a second conductivity type, different from the first conductivity type, and having a first portion on the SiC substrate and a second portion on the first portion remote from the SiC substrate, the second portion having a higher carrier concentration than the first portion, wherein forming the epitaxial SiC base region comprises:

forming a base region epitaxial layer on the SiC substrate;

forming a mask on the base region epitaxial layer; and patterning the base region epitaxial layer according to the mask to provide the epitaxial SiC base region; and wherein forming the epitaxial SiC emitter region comprises:

sequentially forming first and second emitter region epitaxial layers on the SiC substrate;

forming a mask on the second emitter region epitaxial layer; and patterning the first and second emitter region epitaxial layers according to the mask to provide the first and second portions of the epitaxial SiC emitter region.

* * * * *

UNITED STATES PATENT AND TRADEMARK OFFICE
CERTIFICATE OF CORRECTION

| | |
|---|---|
| PATENT NO. | : 7,304,334 B2 |
| APPLICATION NO. | : 11/229474 |
| DATED | : December 4, 2007 |
| INVENTOR(S) | : Agarwal et al. |

It is certified that error appears in the above-identified patent and that said Letters Patent is hereby corrected as shown below:

Column 16, Claim 2, Line 3: Please correct "$1.0 \times 10 \text{ cm}^{-3}$"
To read -- $1.0 \times 10^{16} \text{ cm}^{-3}$ --

Column 16, Claim 2, Line 7: Please correct "$1.0 \times 10^{19} \text{ cm}^{-3}$"
To read -- $1.0 \times 10^{18} \text{ cm}^{-3}$ --

Column 17, Claim 10, Line 29: Please correct "about 110 $\mu$m"
To read -- about 10 $\mu$m --

Signed and Sealed this

Fifteenth Day of April, 2008

JON W. DUDAS
*Director of the United States Patent and Trademark Office*